(12) United States Patent
Shen et al.

(10) Patent No.: US 7,816,771 B2
(45) Date of Patent: Oct. 19, 2010

(54) STACKED CHIP PACKAGE STRUCTURE WITH LEADFRAME HAVING INNER LEADS WITH TRANSFER PAD

(75) Inventors: Geng-Shin Shen, Hsinchu (TW); Wu-Chang Tu, Hsinchu (TW)

(73) Assignees: Chipmos Technologies Inc., Hsinchu (TW); Chipmos Technologies (Bermuda) Ltd., Hamilton (BM)

( * ) Notice: Subject to any disclaimer, the term of this patent is extended or adjusted under 35 U.S.C. 154(b) by 475 days.

(21) Appl. No.: 11/826,516

(22) Filed: Jul. 16, 2007

(65) Prior Publication Data
US 2008/0099896 A1 May 1, 2008

(30) Foreign Application Priority Data
Oct. 26, 2006 (TW) .............................. 95139576 A

(51) Int. Cl.
H01L 23/495 (2006.01)
H01L 23/48 (2006.01)

(52) U.S. Cl. ................. 257/666; 257/777; 257/E23.049

(58) Field of Classification Search ................. 257/666, 257/777, E23.024, E23.049
See application file for complete search history.

(56) References Cited

U.S. PATENT DOCUMENTS

| | | | |
|---|---|---|---|
| 5,373,189 A | 12/1994 | Massit et al. | |
| 5,473,196 A | 12/1995 | De Givry | |
| 5,998,864 A | 12/1999 | Khandros et al. | |
| 6,133,626 A | 10/2000 | Hawke et al. | |
| 6,261,865 B1 | 7/2001 | Akram | |
| 6,376,904 B1 | 4/2002 | Haba et al. | |
| 6,461,897 B2 | 10/2002 | Lin et al. | |
| 6,514,794 B2 | 2/2003 | Haba et al. | |
| 6,605,875 B2 | 8/2003 | Eskildsen | |
| 6,621,155 B1 | 9/2003 | Perino et al. | |
| 6,630,373 B2 | 10/2003 | Punzalan et al. | |
| 6,650,008 B2 | 11/2003 | Tsai et al. | |
| 6,686,651 B1 * | 2/2004 | Foster ........................ 257/666 |
| 6,759,307 B1 | 7/2004 | Yang | |
| 6,843,421 B2 | 1/2005 | Chhor et al. | |
| 6,900,528 B2 | 5/2005 | Mess et al. | |
| 6,949,835 B2 | 9/2005 | Konishi et al. | |
| 7,015,586 B2 | 3/2006 | Chien | |

(Continued)

FOREIGN PATENT DOCUMENTS

TW I233195 5/2005

*Primary Examiner*—Nitin Parekh
(74) *Attorney, Agent, or Firm*—Ming Chow; Sinorica, LLC

(57) ABSTRACT

The present invention provides a stacked chip package structure with leadframe having inner leads with transfer pad, comprising: a leadframe composed of a plurality of inner leads arranged in rows facing each other, a plurality of outer leads, and a die pad, wherein the die pad is provided between the plurality of inner leads arranged in rows facing each other and vertically distant from the plurality of inner leads; an offset chip-stacked structure formed with a plurality of chips stacked together, the offset chip-stacked structure being set on the die pad and electrically connected to the plurality of inner leads arranged in rows facing each other; and an encapsulant covering the offset chip-stacked structure and the leadframe, the plurality of outer leads extending out of said encapsulant; the improvement of which being that the inner leads of the leadframe are coated with an insulating layer and a plurality of metal pads are selectively formed on the insulating layer.

3 Claims, 23 Drawing Sheets

U.S. PATENT DOCUMENTS 7,095,104 B2 8/2006 Blackshear
7,145,247 B2 12/2006 Kawano et al.
7,242,100 B2 7/2007 Oka
2005/0082645 A1* 4/2005 Lee et al. .................... 257/666
2005/0121753 A1 6/2005 Lee et al.
2006/0027902 A1* 2/2006 Ararao et al. ............... 257/676
2006/0151858 A1* 7/2006 Ahn et al. ................... 257/666

* cited by examiner

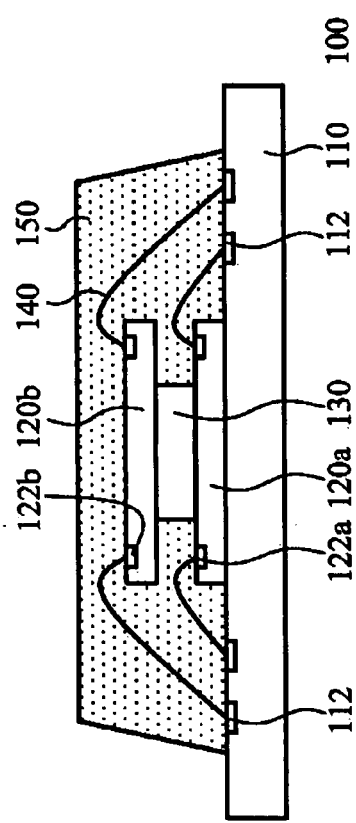
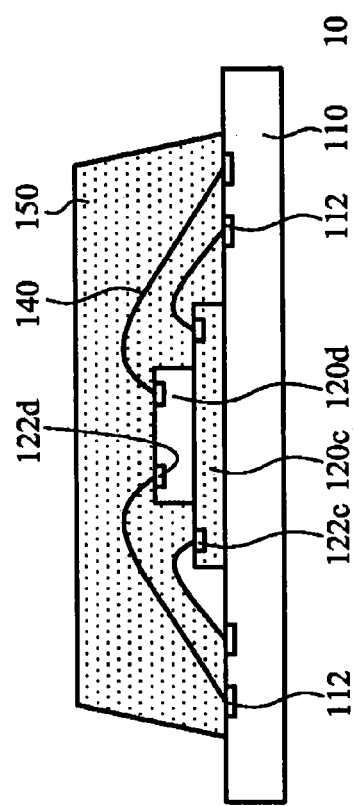
FIG. 1A
FIG. 1B

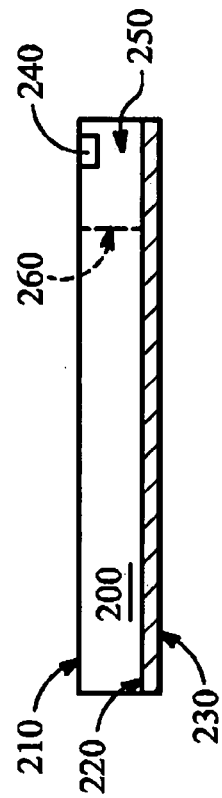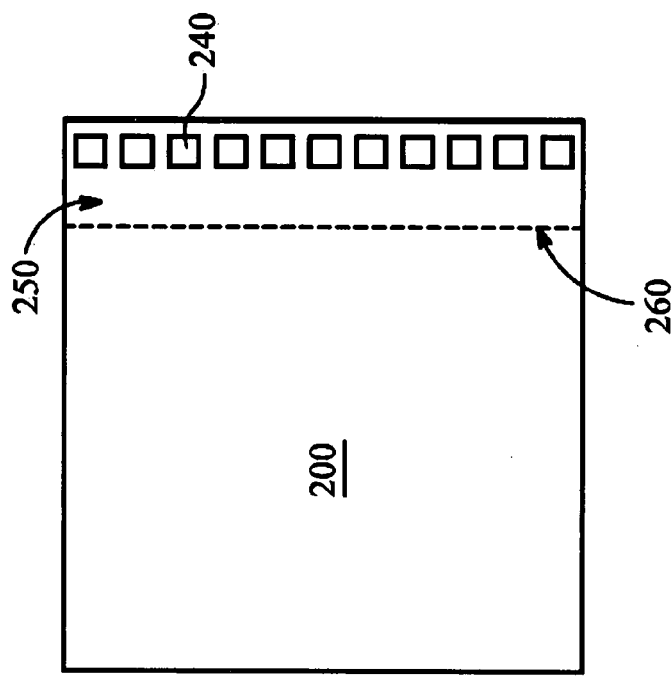

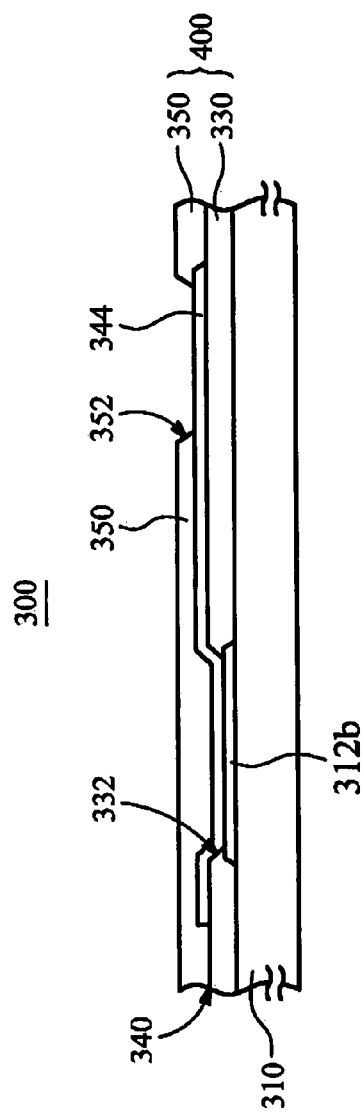
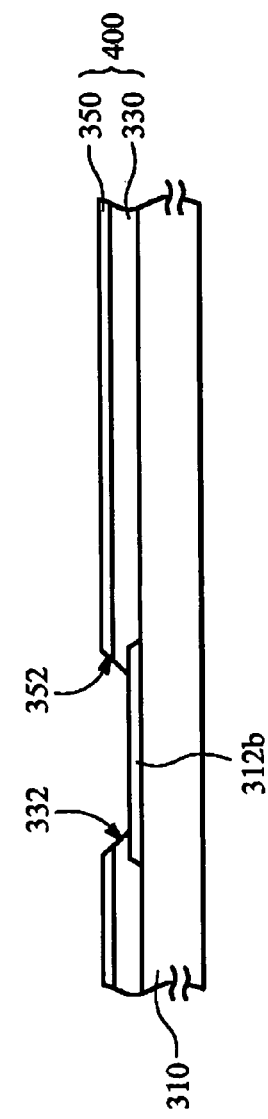
FIG. 4A
FIG. 4B

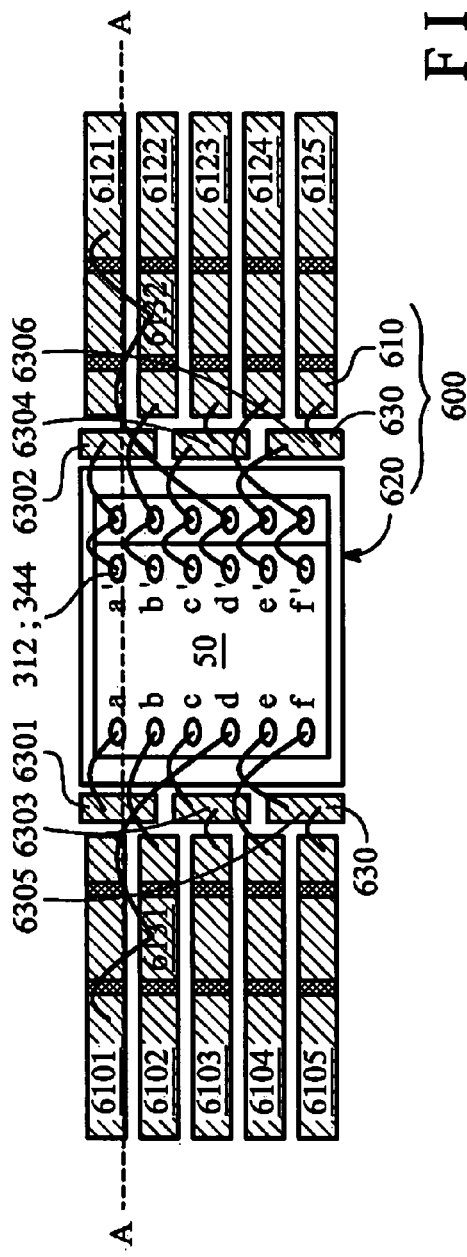
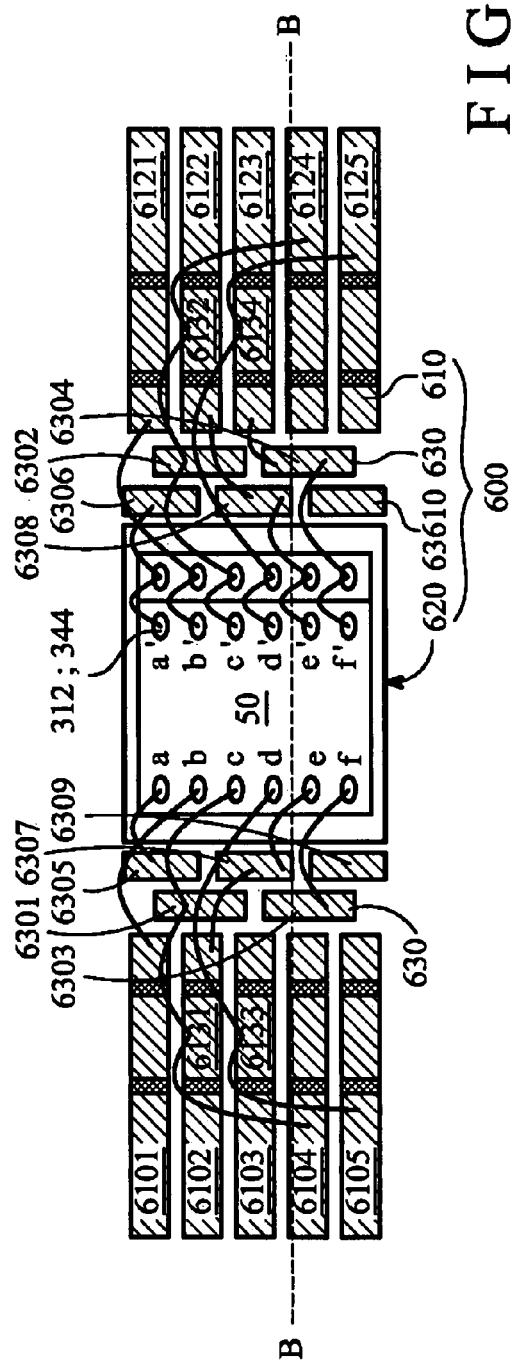

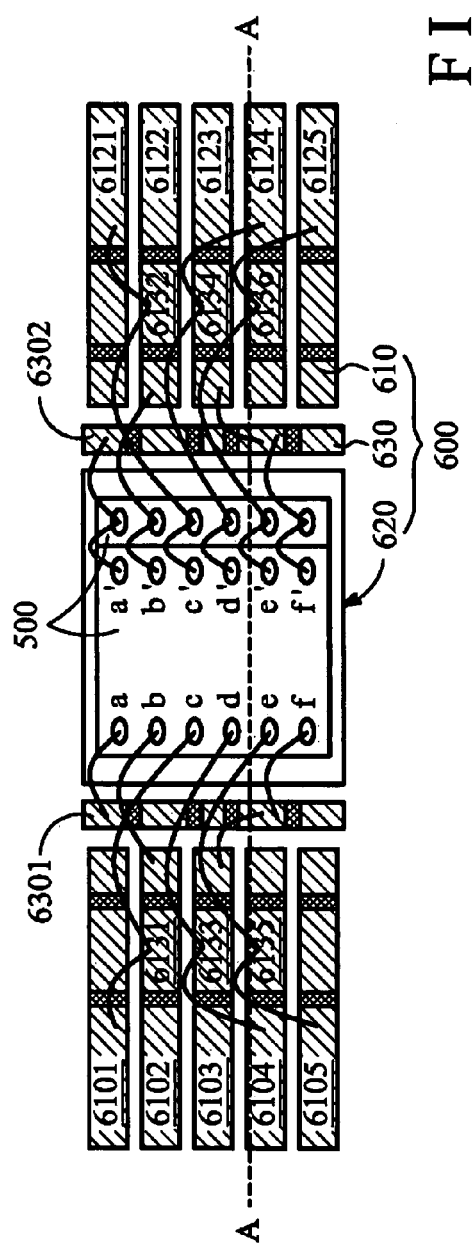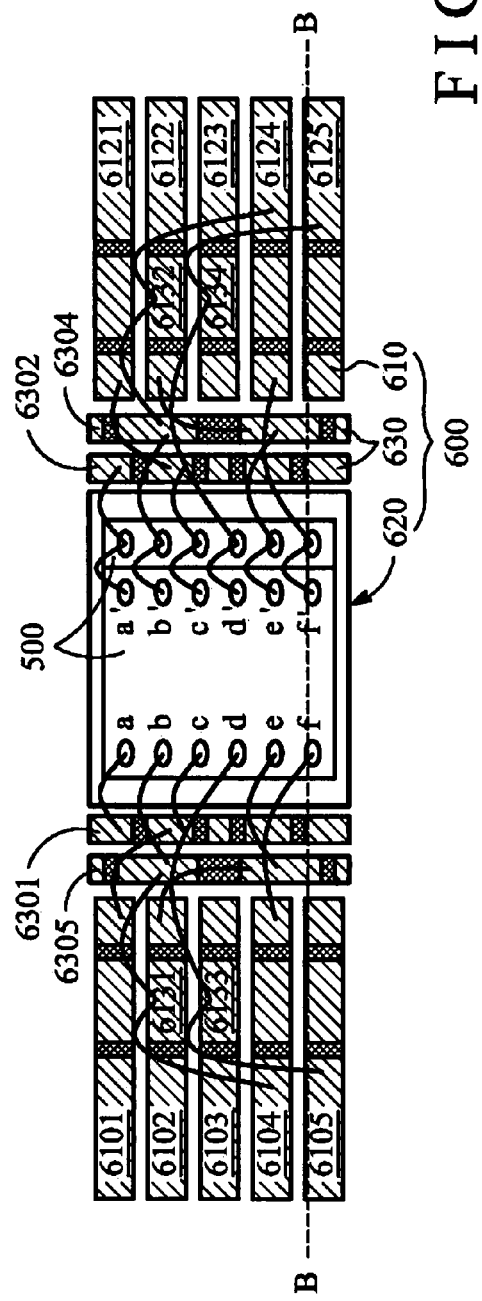

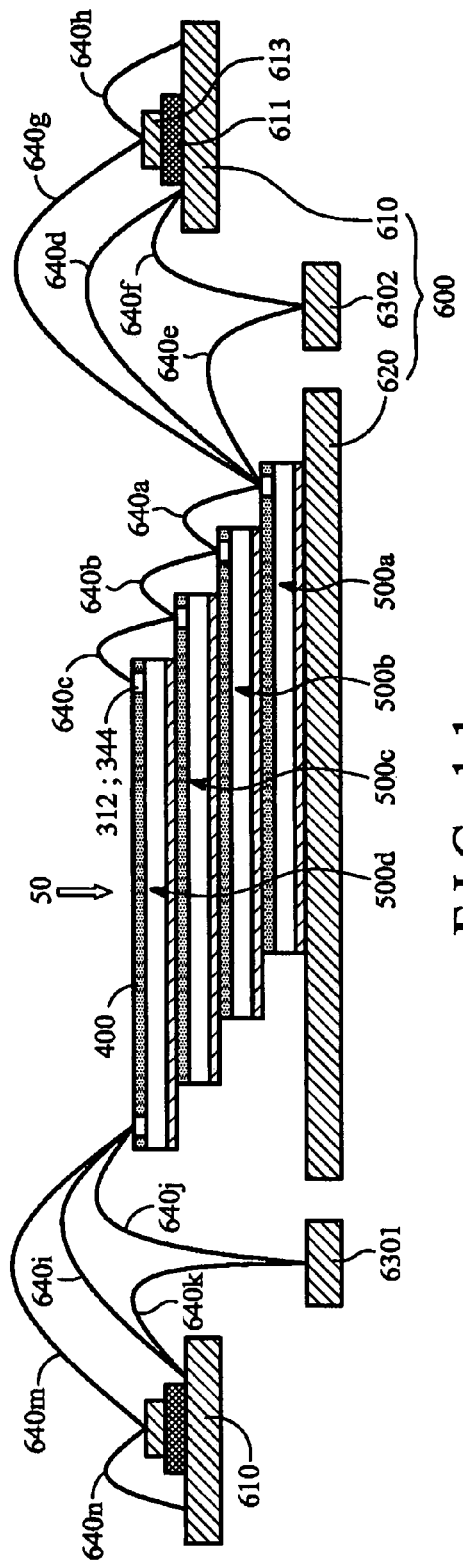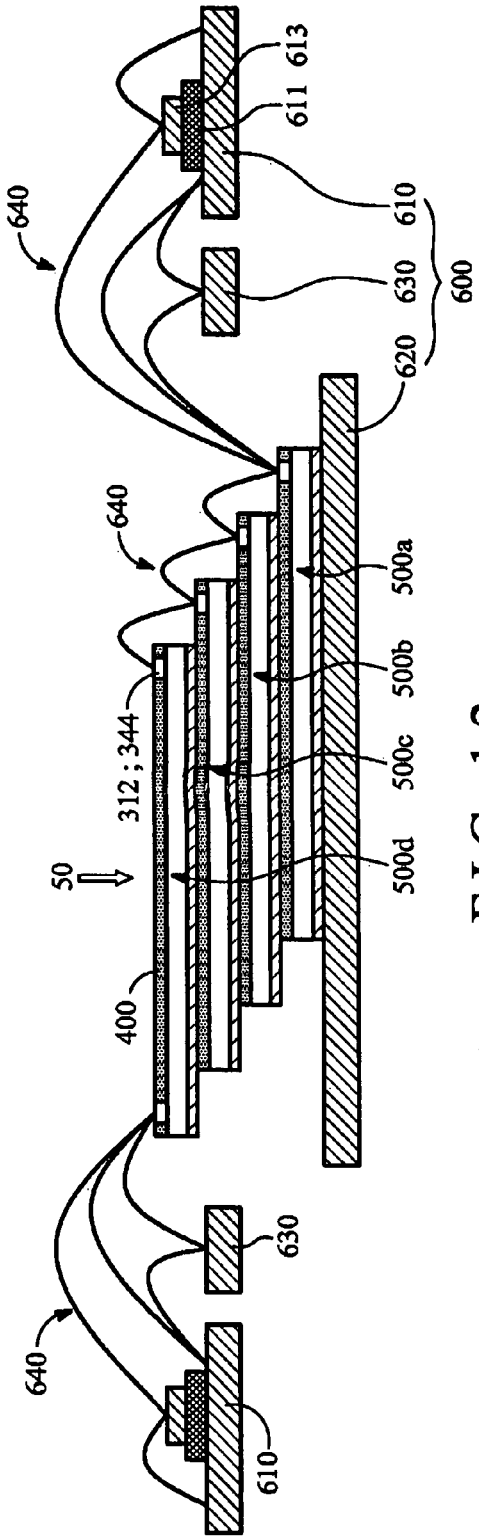

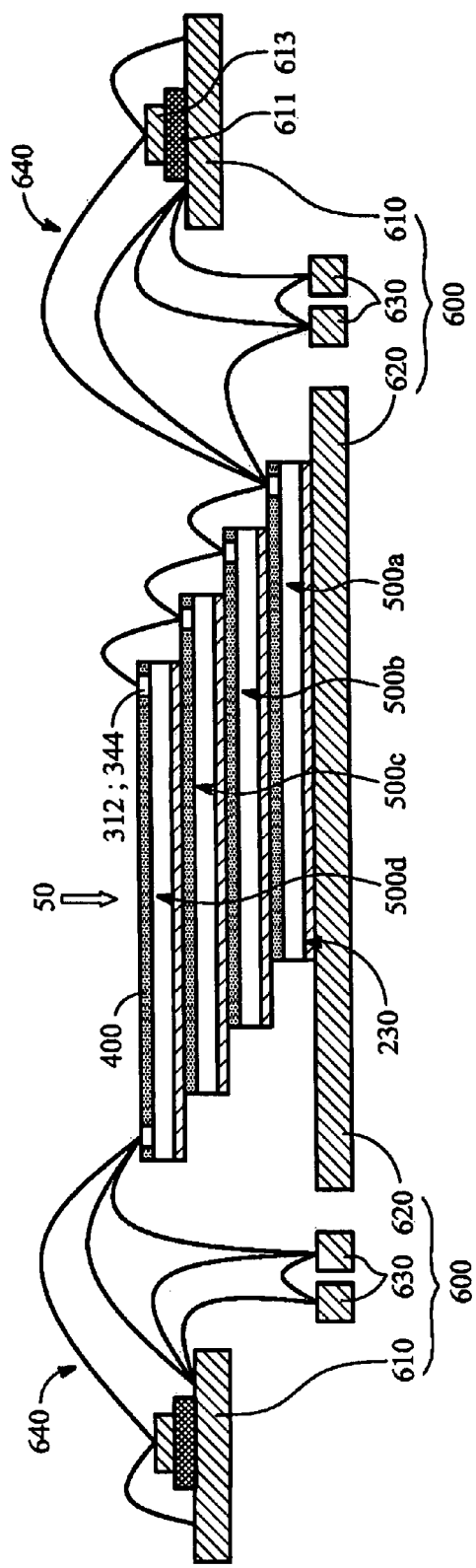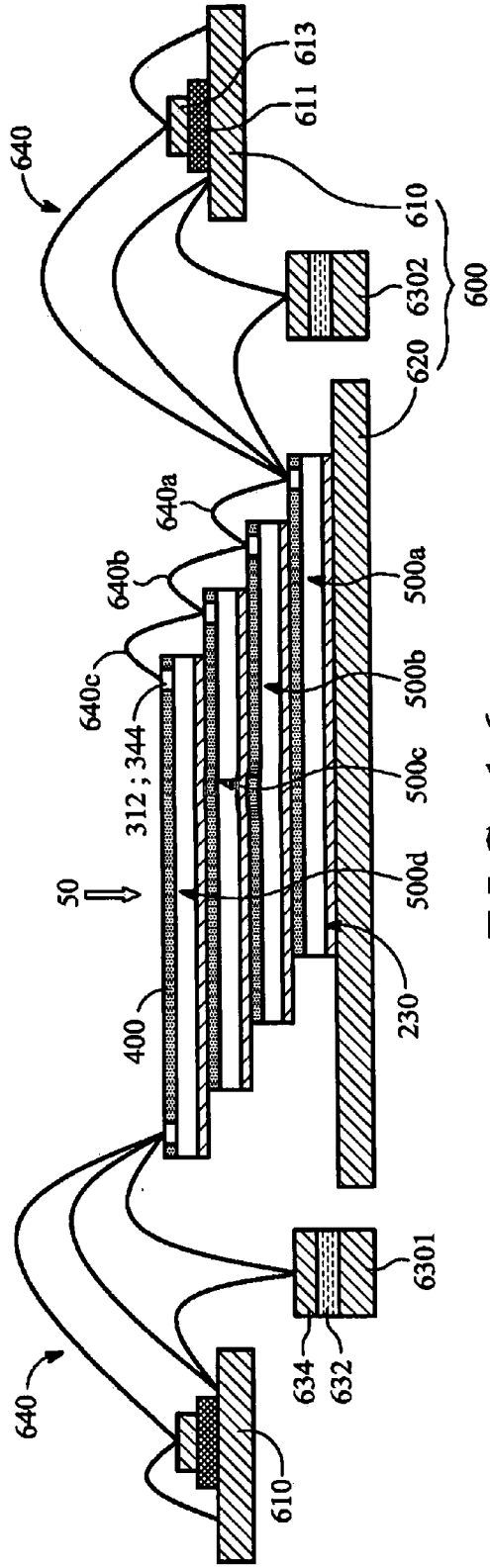

STACKED CHIP PACKAGE STRUCTURE WITH LEADFRAME HAVING INNER LEADS WITH TRANSFER PAD

BACKGROUND OF THE INVENTION

1. Field of the Invention

The present invention relates to an offset chip-stacked package structure, and more particularly, to an offset chip-stacked structure with leadframe having inner leads with transfer pad.

2. Description of the Prior Art

In semiconductor post-processing, many efforts have been made for increasing scale of the integrated circuits such as memories while minimizing the occupied area. Accordingly, the development of three-dimensional (3D) packaging technology is in progress and the idea of making up a chip-stacked structure has been disclosed.

The prior art has taught that a chip-stacked structure can be formed by firstly stacking a plurality of chips and then electrically connecting the chips to the substrate in a wire-bonding process. FIG. 1A is a cross-sectional view of a prior chip-stacked package structure stacked by chips of same or similar size. As shown in FIG. 1A, a conventional chip-stacked package structure 100 includes a package substrate 110, chips 120a and 120b, a spacer 130, the wires 140, and an encapsulant 150. The package substrate 110 has many pads 112 on it and the chips 120a and 120b are also respectively provided with pads 122a and 122b arranged in peripheral type. The chip 120a is provided on the substrate 110, while the chip 120b is provided on the chip 120a with a spacer 130 intervened there-between. The chip 120a is electrically connected to the substrate 110 by bonding two ends of one of the wires 140 to the pads 112 and 122a respectively. The chip 120b is electrically connected to the substrate 110 in similar manner. The encapsulant 150 is then provided on the substrate 110 to cover the chips 120a and 120b and the wires 140.

Since the pads 122a and 122b are respectively provided at the peripheral of the chip 120a and the 120b, there is a need to apply the spacer 130 to prevent the chip 120b from directly contacting with the chip 120a for performing the subsequent wire-bonding. However, the use of spacer 130 increases the thickness of the chip-stacked package structure 100.

Another prior chip-stacked package structure for different-sized chips has been disclosed. Referring to FIG. 1B, another conventional chip-stacked package structure 10 includes a package substrate 110, chips 120c and 120d, the wires 140, and an encapsulant 150. The substrate 110 has pads 112 on it. The chip 120c is larger than the chip 120d in size. The chips 120c and 120d are respectively provided with peripherally arranged pads 122c and 122d. The chip 120c is provided on the substrate 110 while the chip 120d is provided on the chip 120c. The chip 120c is electrically connected to the substrate 110 by bonding two ends of one of the wires 140 to the pads 112 and 122c respectively. The chip 120d is electrically connected to the substrate 110 in similar manner. The encapsulant 150 is then provided on the substrate 110 to cover the chips 120c and 120d and the wires 140.

Since chip 120d is smaller than chip 120c, chip 120d would not cover the pads 122c of the chip 120c when the chip 120d is stacked on the chip 120c. However, the condition that the upper chip must have size smaller than that of the lower chip limits number of the chips to be stacked in the chip-stacked package structure 10.

In other words, the above-mentioned chip-stacked package structures have drawbacks of either increasing thickness or limiting number of the chips to be stacked. Moreover, there are also other problems that may lower reliability and yield of the chip-stacked structures during processing when wire-jumping or wire-crossing bonding of the chips is considered. For example, a high-pressured mold-flow injection during molding may cause the jumping or crossing wires to shift and become short.

SUMMARY OF THE INVENTION

In view of the drawbacks and problems of the prior chip-stacked package structure as mentioned above, the present invention provides a new three-dimensional chip-stacked structure for packaging multi-chips with similar size.

It is an object of the present invention to provide an offset chip-stacked structure for packaging with leadframe having the inner leads formed with a plurality of metal pads and so as to make circuit design more flexible and gain higher reliability.

It is another object of the present invention to provide an offset chip-stacked structure for packaging with leadframe having bus bar and so as to make circuit design more flexible and gain higher reliability.

According to abovementioned objects, the present invention provides a chip-stacked package structure for leadframe having inner leads formed with transfer pads, comprising: a leadframe composed of a plurality of inner leads arranged in rows facing each other, a plurality of outer leads, and a die pad, wherein the die pad is provided between the plurality of inner leads arranged in rows facing each other and is vertically distant from the plurality of inner leads; an offset chip-stacked structure formed with a plurality of chips stacked together, the offset chip-stacked structure being set on the die pad and electrically connected to the plurality of inner leads arranged in rows facing each other; and an encapsulant covering the offset chip-stacked structure and the leadframe, the plurality of outer leads extending out of said encapsulant; the improvement of which is that the inner leads of the leadframe are coated with an insulating layer and a plurality of metal pads are selectively formed on the insulating layer.

The present invention then provides a leadframe structure with inner leads having transfer pads, comprising a plurality of inner leads arranged in rows facing each other, a plurality of outer leads, and a die pad provided between the plurality of inner leads and vertically distant from the inner leads. The improvement of which is that the inner leads are partially coated with an insulation layer selectively formed with a plurality of metal pads.

The present invention further provides a leadframe structure comprising a plurality of inner leads and a plurality of outer leads. The plurality of inner leads comprises a plurality of first inner leads in parallel and a plurality of second inner leads in parallel. The ends of first inner leads and second inner leads are arranged in rows facing each other at a distance. The first inner leads are equipped with a down-set structure, which results in different vertical heights of the position of the end of first inner leads and the position of the end of second inner leads. The improvement of which is that the first inner leads or the second inner leads or the ends of the first and the second inner leads are partially coated with an insulation layer selectively formed with a plurality of metal pads.

BRIEF DESCRIPTION OF THE DRAWINGS

FIG. 1 is a diagram schematically showing a conventional chip-stacked package structure.

FIG. 2A is a top-elevational view schematically showing the chip-stacked structure according to the present invention.

FIG. 2B is a cross-sectional view schematically showing the chip-stacked structure according to the present invention.

FIGS. 4A to 4B are cross-sectional views schematically showing the bonding area on the redistribution layer according to the present invention.

FIGS. 8A to 8B are top-elevational views schematically showing an offset chip-stacked package structure according to another embodiment of the present invention.

FIGS. 9A to 9B are top-elevational views schematically showing an offset chip-stacked package structure according to still another embodiment of the present invention.

FIG. 11 is a cross-sectional view schematically showing an offset chip-stacked package structure according to an embodiment of the present invention.

FIG. 12 is a cross-sectional view schematically showing an offset chip-stacked package structure according to another embodiment of the present invention.

FIG. 15 is a cross-sectional view schematically showing an offset chip-stacked structure according to another embodiment of the present invention.

FIG. 16 is a cross-sectional view schematically showing an offset chip-stacked structure according to another embodiment of the present invention.

DESCRIPTION OF THE PREFERRED EMBODIMENT

The present invention will now be described more fully hereinafter with reference to the accompanying drawings, in which preferred embodiments are shown. In the following, the well-known knowledge regarding the chip-stacked structure of the invention such as the formation of chip and the process of thinning the chip would not be described in detail to prevent from arising unnecessary interpretations. However, this invention will be embodied in many different forms and should not be construed as limited to the embodiments set forth herein.

According to the semiconductor packaging process, a Front-End-Process experienced wafer is performed a thinning process firstly to reduce the thickness to a value between 2 mil and 20 mil, and then the polished wafer is applied with a polymer material such as a resin or a B-Stage resin by coating or printing. Next, a post-exposure baking or lighting process is applied to the polymer material so that the polymer material becomes a viscous semi-solidified gel-like material. Subsequently, a removable tape is attached to the viscous semi-solidified gel-like material and then the wafer is sawed into chips or dies. At last, these chips or dies are stacked on and connected to a substrate to form a chip-stacked structure.

Figure 2C:
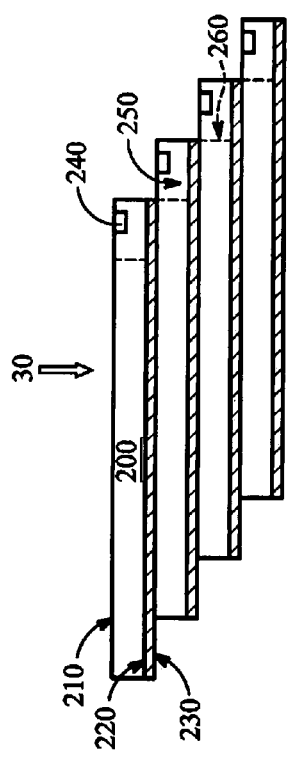
FIGS. 2C to 2E are cross-sectional views schematically showing the offset chip-stacked structure according to the present invention.

Referring to FIGS. 2A and 2B, a chip 200 experiencing the above-mentioned processes has an active surface 210 and a back surface 220 in opposition to the active surface 210 with an adhesive layer 230 formed on the back surface 220. It is to be noted that the adhesive layer 230 is not limited to the above-mentioned semi-solidified gel-like material and can be any adhesive material, such as die-attached film, for connecting the chip 200 and a substrate together. Moreover, the active surface 210 is thereon provided with a plurality of pads 240 arranged along a side edge. Accordingly, an offset chip-stacked structure 30 as shown in FIG. 2C can be formed. The offset chip-stacked structure 30 is a ladder-like structure formed by aligning the side edge of upper chips with the edge line 260 of the bonding area 250 on lower chips. The edge line 260 herein is a line for reference only but not a line that exists on chip 200.

Figure 2D:
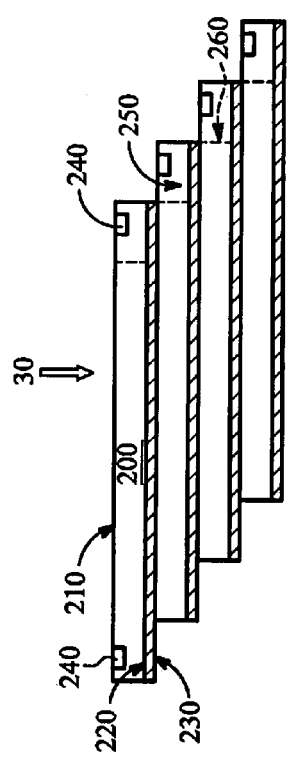
Figure 2E:
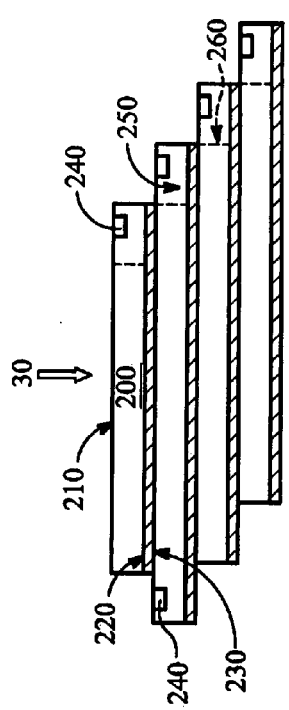

Referring to FIG. 2D, the uppermost chip of the structure 30 can further have same pads as the pads 240 on the other side for providing more connections with the substrate. Referring to FIG. 2E, the size of the uppermost chip of the structure 30 can be smaller than that of the lower one. The arrangement of the pads 240 or the size of the chips described herein is for embodying but not limiting the invention. Any chip-stacked structure satisfying the above-mentioned statement would be regarded as an aspect of the invention.

Figures 3A, 3B, 3C:
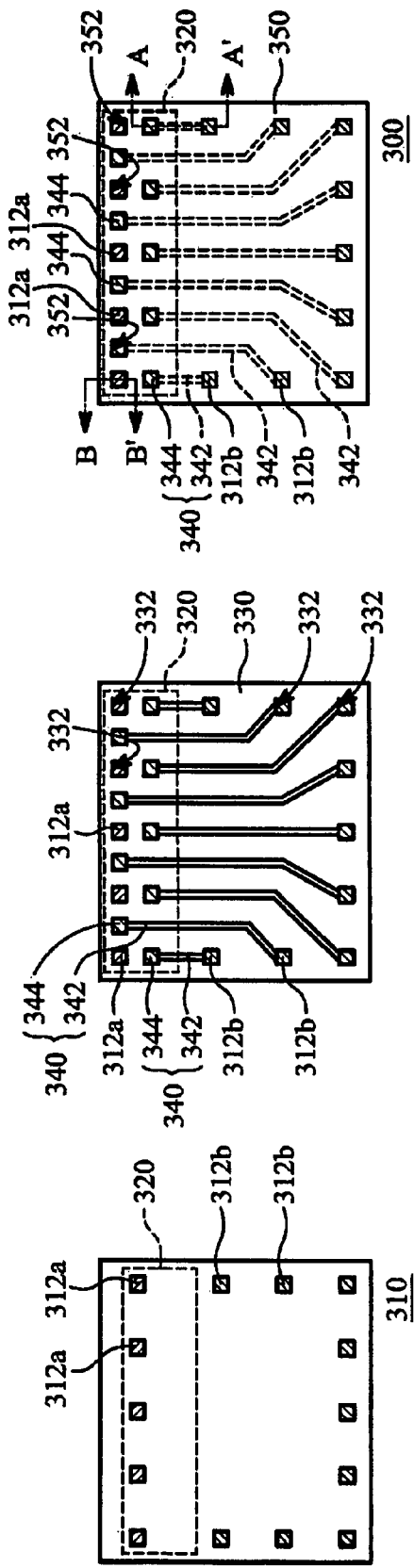
FIGS. 3A to 3C are diagrams schematically showing the redistribution layer formed in a process according to the present invention.

Referring to FIGS. 3A to 3C, the process of making a chip with redistribution layer is disclosed. According to the present invention, a redistribution layer (RDL) is formed with pads provided along a side edge of the chip and the details are described as follows.

As shown in FIG. 3A, the chip 310 has first pads 312a and second pads 312b on the active surface and along side edges. The first pads 312a are pads located inside a bonding area 320, while the second pads 312b are pads located outside the bonding area 320. As shown in FIG. 3B, a first passivation layer 330 with a plurality of first openings 332 for exposing the first pads 312a and the second pads 312b is first formed on the chip 310, and a redistribution layer 340 with a plurality of conductive wires 342 and a plurality of third pads 344 is then formed on the first passivation layer 33. The third pads 344 are located inside the bonding area 320 and the conductive wires 342 electrically connect the second pads 312b and the third pads 344. The redistribution layer 340 is made up of conductive materials such as gold, copper, nickel, titanium tungsten, titanium or others. As shown in FIG. 3C, a whole chip structure 300 is completed by forming a second passivation layer 350 with a plurality of second openings 352 on the redistribution layer 340 to cover the area rather than the first pads 312a and the third pads 344 but expose the first pads 312a and the third pads 344.

It is to be noted that the first pads 312a and the second pads 312b can be arranged on surface of the chip 310 not only in the above-mentioned peripheral type but also in an area array type or other types rather than the above-mentioned types, provided that the second pads 312b are electrically connected with the third pads 344 via the conductive wires 342. Moreover, the third pads 344 can be arranged in a manner of being along side edge of the chip 310 and in parallel to the pads 312a such as shown in FIG. 3B or other manners provided that the third pads 344 are located inside the bonding area 320.

Referring now to FIGS. 4A and 4B, which are cross-sectional views drawn along section lines A-A' and B-B'. As shown in FIGS. 4A and 4B, the whole chip structure 300 is composed of the chip 310 and the redistribution layer 400. The redistribution layer 400 is composed of first passivation layer 330, the redistribution layer 340, and the second passivation layer 350. The bonding area 320 of the chip 310 is a side edge adjacent to the chip 310. Moreover, the chip 310 has a plurality of first pads 312a and second pads 312b, wherein the first pads 312a are inside the bonding area 320 and the second pads 312b are outside the bonding area 320.

The first passivation layer 330 disposed on the chip 310 has a plurality of first openings 332 to expose these first pads 312a and second pads 312b. The redistribution layer 340 with a plurality of third pads 344 is disposed on the first passivation layer 330 and extends from second pads 312b to bonding area 320, where the third pads are located. The second passivation layer 350 covers the redistribution layer 340 and expose first pads 312a and third pads 344 through a plurality of second openings 352. Since the first pads 312a and third pads 344 are in the bonding area 320, the area rather than the bonding area 320 on the second passivation layer 350 is capable of carrying another chip structure and therefore accomplishing an offset chip-stacked structure 30.

Figure 5A:
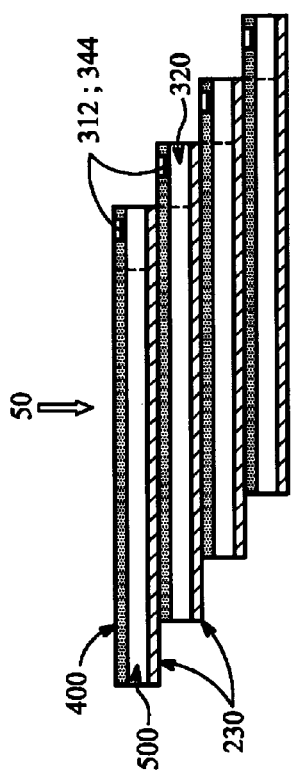
FIGS. 5A to 5C are cross-sectional views schematically showing an offset chip-stacked structure with redistribution layer according to the present invention.
Figure 5B:
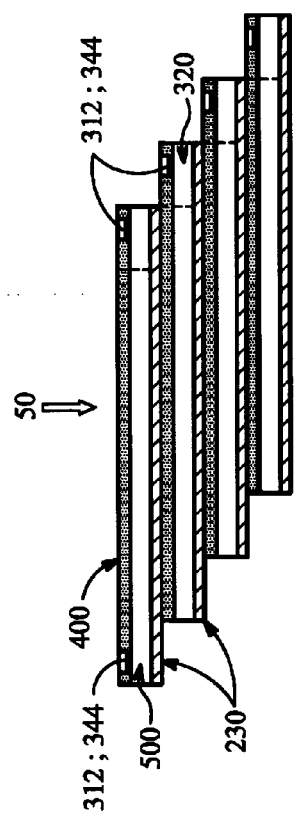
Figure 5C:
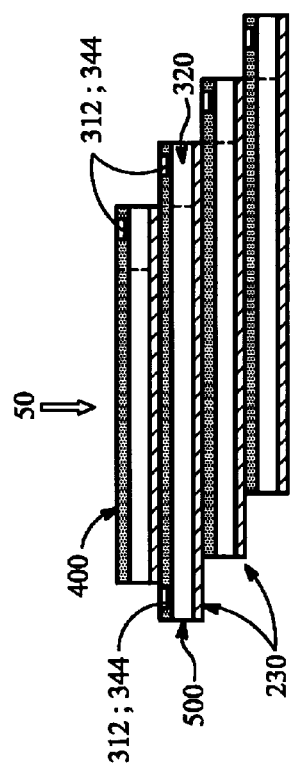

Referring to FIG. 5, shows an offset chip-stacked structure 50 of the present invention. An offset chip-stacked structure 50 includes a plurality of stacked chips 500. Each of the chips 500 is formed with a redistribution layer 400 so that each of the chips 500 can be provided with pads inside the bonding area 320 on each chip. In this way, the offset chip-stacked structure 50 is formed by aligning the side edge of upper chips with an edge line of the bonding area 320 on lower chips and an adhesive layer 230 formed by a polymer material is used to connect any two chips among the plurality of chips 500. Moreover, as shown in the present embodiment in FIG. 5B, the uppermost chip of the offset chip-stacked structure 50 can further have same pads as the pads 312 on the other side for providing more connections with the substrate and the method for forming this kind of structure is as shown in FIG. 4. Referring to FIG. 5C, the uppermost chip of the offset chip-stacked structure 50 can have size smaller than that of the lower one. The arrangement of the pads 312 and 344 or the size of the chips 500 described herein is for embodying but not limiting the invention. Any chip-stacked structure satisfying the above-mentioned statement would be regarded as an aspect of the invention. For example, each of the chips 500 can be formed with bonding areas that are not only on the right side as shown in FIGS. 5A to 5B but also on the left side.

In the following, two offset chip-stacked structures each connected with leadframes according to the present invention will be disclosed, in which the above-mentioned offset chip-stacked structure 50 will be taken as an example for illustration. However, the following descriptions can also be applied to the above-mentioned offset chip-stacked structure 30.

Figure 6:
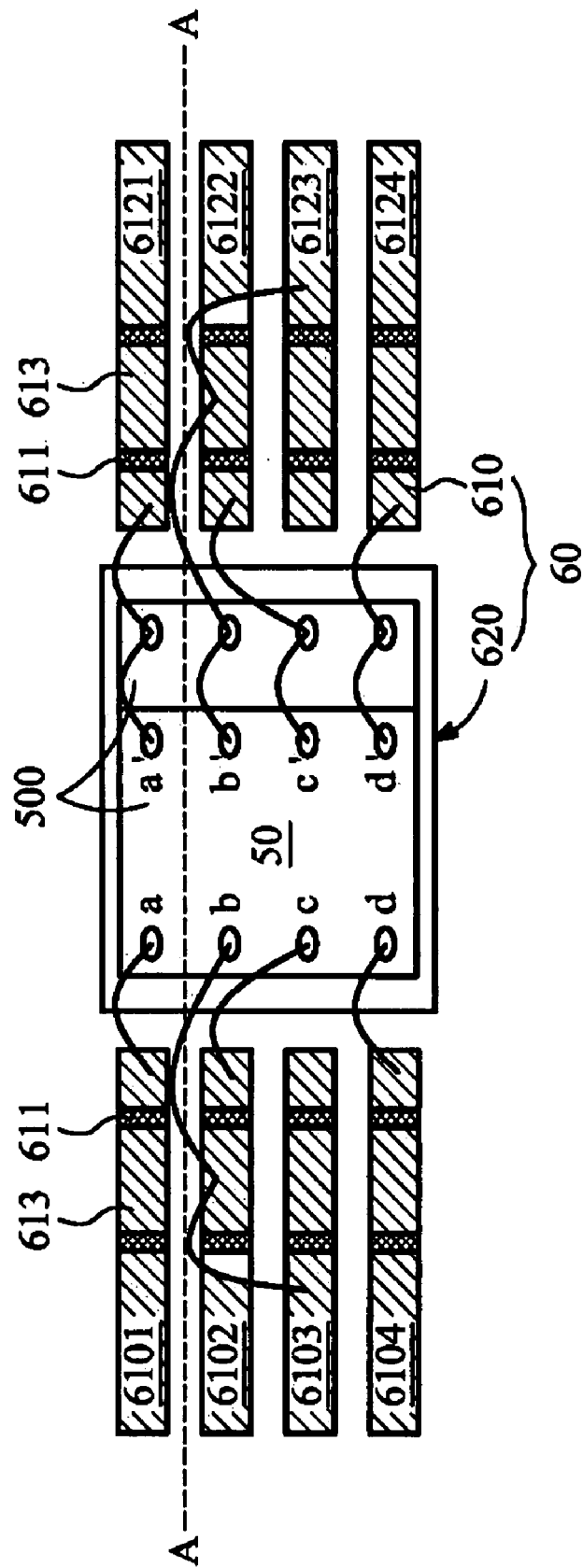
FIG. 6 is a top-elevational view schematically showing an offset chip-stacked package structure according to the present invention.

Referring to FIG. 6, which is a plane view of a chip-stacked package structure of the present invention. As shown in FIG. 6, a chip-stacked package structure includes a leadframe 60 and an offset chip-stacked structure 50. The leadframe 60 includes a plurality of inner leads 610 arranged in rows facing each other, a plurality of outer leads (not shown) and a die pad 620 provided between the inner leads 610. Herein, the inner leads 610 and the die pad 620 are vertically at the same or different height. According to this embodiment, the offset chip-stacked structure 50 is fixedly connected to the die pad 620 with an adhesive layer 230 and electrically connected to inner leads 610 of the leadframe 60 via the metal wires 640. The adhesive layer 230 in the present invention is not limited to the above-mentioned semi-solidified gel-like material and can be any adhesive material, such as die attached film, for joining the offset chip-stacked structure 50 and the die pad 620 together. Moreover, the pads 312a and 344 in the bonding area 320 of chip 500 can be arranged in single row, two rows, or other manners and is not limited in the present invention.

Referring to FIG. 6, an insulation layer 611 is further provided on the partial position of inner leads 610 in the present invention and at least one metal pad 613 is provided on the insulation layer 611, which provides the leadframe 600 in chip-stacked package structure of present invention with more contacts for electrical connections such as ground connections or signal connections. With more transfer pads on inner leads 610, the circuit design can become more flexible and be applied more extensively.

The insulation layer 611 is formed by coating or printing a polymer material such as polyimide (PI) or by attaching a tape such as die attached film. The metal pads 613 herein can be metal layers formed on the insulation layer 611 by plating process or etching process. It is to be noted that the insulation layer 611 of the present invention can be provided on the entire inner leads 610, or formed only on part of the inner leads 610, or formed only on fragmental sections of the inner leads 610. Moreover, an insulation layer can be further formed on metal pads (insulation layer) 611 and metal pads can be further provided on this insulation layer so that the inner leads 610 can be provided with more transfer pads.

The description will go to the part of using the metal pads on inner leads 610 to accomplish jumping connections of metal wires 640. Referring again to FIG. 6, the pad with letter "b" ("b'") and the pad with letter "c" ("c'") on the chip 500 are connected to the inner lead 6103 (6123) and the inner lead 6103 (6123) respectively. Apparently, the metal pads 613 on the inner leads 610 are respectively served as transferring pads for making jumping connections between the pad with letter "b" ("b'") on the chip 500 and the inner lead 6103 (6123) and between the pad with letter "c" ("c'") on the chip 500 and the inner lead 6102 (6122), and thus the metal wires 640 would not cross each other. For example, the pad with letter "b" on chip 500 is first connected to the metal pad 613 on inner lead 6102 with a metal wire 640, and then the metal pad 613 on inner lead 6102 is connected to the inner lead 6103 with another metal wire 640. Thus, the connection of the pad with letter "b" and inner lead 6103 can be completed without crossing the metal wire 640 connecting the pad with letter "c" and the inner lead 6102. Then, the pad with letter "a" and the inner lead 6101 are connected with a metal wire 640, the pad with letter "c" on chip 500 is connected to the bus bar 6102, and then the pad with letter "d" and the bus bar 6102 are connected with another metal wire 640. Thus, the connection of pad with letter "b" and the inner lead 6103 can be completed without crossing another metal wire 640 connecting pad with letter "c" and inner lead 6102. Similarly, the pads with letter "b'" and letter "c'" on the other side edge are respectively connected to inner leads 6123 and 6122 by jumping metal wires 640 with metal pads 613 serving as transferring pads.

Figure 7A:
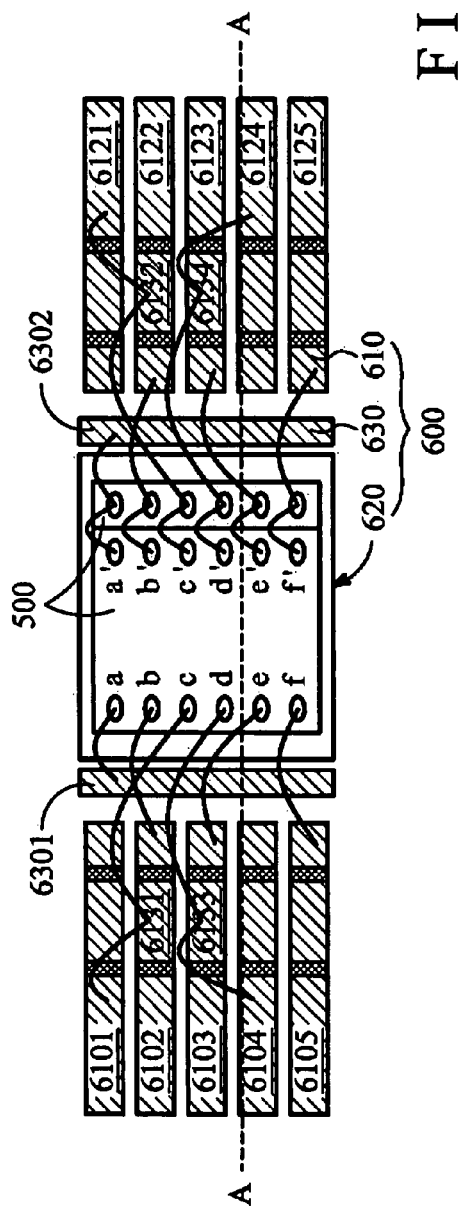
FIGS. 7A to 7B are top-elevational views schematically showing an offset chip-stacked package structure according to another embodiment of the present invention.
Figure 7B:
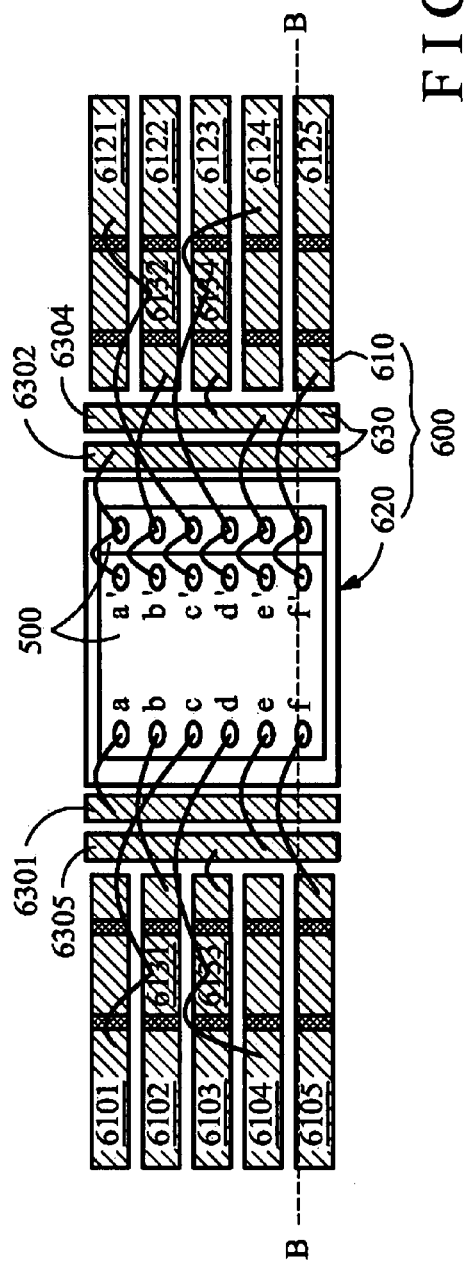

Then, referring to FIGS. 7A and 7B, the leadframe 600 in the chip-stacked package structure of the present invention further comprises at least a bus bar 630 provided between the die pad 620 and the plurality of inner leads 610 arranged in rows facing each other, wherein the bus bar 630 can be arranged in a stripe-shaped configuration as shown in FIGS. 6A and 6B or in a ring-shaped configuration (not shown). Moreover, the pads 312/344 inside the bonding area 320 of the chip 500 can be arranged in single row or two rows.

The description will go to the part of using the bus bar 630 and inner leads 610 to accomplish jumping connections of metal wires 640. Referring again to FIG. 7A, the pad on the chip 500 are connected to the bus bar 630 and the inner leads 610. Apparently, the bus bars 6301 and 6302 are respectively served as transfer pads for ground connection for making jumping connections between the pad with letter "a" and the inner lead 6101 and between the pad with letter "a'" and the inner lead 6121. Then, referring to the diagram showing the connection between pads with letter "c" ("c'") on the chip 500 and the inner leads 6101 (6121) and between the pads with letter "d" ("d'") on the chip 500 and the inner leads 6103 (6123). Apparently, in the present embodiment, the pads with letter "c" and "c'" on the chip 500 can be first connected to the metal pads 6131 on inner lead 6102 and the metal pads 6132 on inner lead 6122 with a metal wire 640, and the metal pads 6131 and 6132 can then be connected to the inner leads 6101 and 6121 with another metal wire 640; then the pads with letter "d" and "d'" can be first connected to the metal pads 6133 on inner lead 6103 and the metal pads 6134 on inner lead 6123, and the metal pads 6133 and 6134 can then be connected to the inner leads 6104 and 6124 with another metal wire 640. Thus, the connection of pads with letter "c" and "c'" and the inner leads 6101 and 6121 can be completed without crossing another metal wire 640 connecting pad with letter "b" ("b'") and inner lead 6102 (6122). Also, the connection of pads with letter "d" and "d'" and the inner leads 6104 and 6124 can be completed without crossing another metal wire 640 connecting pad with letter "e" ("e'") and inner lead 6103 (6123).

Referring to FIG. 7B, the structure with more than one bus bar 630 is provided to complete the jumping connection. In FIG. 7B, the pads with letter "c" ("c'"), "d" ("d'"), and "e" ("e'") on the chip 500 are connected to the inner leads 6101 (6121), 6104 (6124), and 6103 (6123), wherein the pads with letter "a" and "a'" are connected to the bus bars 6301 and 6302 and served as transfer pads for ground connection. Apparently, in the present embodiment the bus bars 6301 and 6302 can be used for ground connection, and the bus bars 6305 and 6304 can be used for signal connection. For example, the pads with letter "c" and "c'" on chip 500 are first connected to the metal pad 6131 on inner lead 6102 and the metal pad 6132 on inner lead 6122 with a metal wire 640, and then the metal pads 6131 and 613 are connected to the inner leads 6101 and 6121 with another metal wire 640. On the other hand, the pads with letter "d" and "d'" are first connected to the metal pad 6133 on inner lead 6103 and the metal pad 6134 on inner lead 6123 with a metal wire 640, and then the metal pads 6133 and 6134 are connected to the inner leads 6104 and 6124 with another metal wire 640. And then, the pads with letter "e" and "e'" are first connected to the bus bars 6305 and 6304 with a metal wire 640, and then the bus bars 6305 and 6304 are connected to the inner leads 6103 and 6123 with another metal wire 640. Thus, the connection of pads with letter "c" and "c'" and the inner leads 6101 and 6121 can be completed without crossing another metal wire 640 connecting pad with letter "b" ("b'") and inner lead 6102 (6122). Also, the connection of pads with letter "d" and "d'" and the inner leads 6104 and 6124 can be completed without crossing another metal wire 640 connecting pad with letter "e" ("e'") and inner lead 6103 (6123).

Consequently, the metal pads 613 (i.e. 6131~6134) on inner leads of leadframe 600 and bus bars 630 (i.e. 6301~63010) according to the present invention provides a plurality of transfer pads for jumping connections to prevent metal wires from crossing each other and avoid unnecessary short. Meanwhile, the metal pads 613 and bus bars 630 make the circuit design more flexible and raise the reliability in package processing.

In the following, referring to FIGS. 8A and 8B, which are plain views of another embodiment of chip-stacked package structure of the present invention. As shown in FIGS. 8A and 8B, the chip-stacked package structure comprises a leadframe 600 and an offset chip-stacked structure 50. The leadframe 600 is composed of a plurality of inner leads 610 arranged in rows facing each other, a plurality of outer leads (not shown), and a die pad 620 provided between the plurality of inner leads 610. The plurality of inner leads and the die pad 620 can be vertically distant or at the same height. In the present embodiment, an insulation layer 611 is further provided on the partial position of inner leads 610 and at least one metal pad 613 is provided on the insulation layer 611, which provides the leadframe 600 with more contacts for electrical connections such as power connections, ground connections, or signal connections. With more transfer pads 613 on inner leads 610, the circuit design can become more flexible and be applied more extensively. Moreover, in the present embodiment, the leadframe 600 can further comprise at least one bus bar 630 provided between the die pad 620 and the plurality of inner leads 610 arranged in rows facing each other, wherein at least one bus bar 630 can be arranged in a stripe-shaped configuration and each stripe-shaped bus bar 630 is formed by a plurality of metal fragments (i.e. 6301~63010) as shown in FIGS. 8A and 8B; or the bus bars 630 can also be arranged in a ring-shaped configuration and each ring-shaped bus bar 630 is formed by a plurality of metal fragments. The shape of bus bars is not limited in the present invention. Moreover, as described above, the pads 312/344 inside the bonding area 320 of the chip 500 can be arranged in single row or two rows and is not limited in the present invention. Furthermore, the leadframe 600 is provided with many bus bars 630 formed by independent metal fragments (i.e. 6301~6306) and these metal fragments can all be used for electrical connections such as power connections, ground connections, or signal connections, and thus the circuit design can be more flexible and applied more extensively.

The description will go to the part of using the bus bar 630 to accomplish jumping connections of metal wires 640. Referring again to FIG. 8A, the pads on the offset chip-stacked structure 50 are connected to the inner leads of the leadframe. Apparently, the metal pads 613 on the inner leads 610 and the plurality of metal fragments (such as 6301~6306) that form the bus bar 630 are served as transfer pads for making jumping connections between the pads with letters from "a" ("a'") to "f" ("f'") and the inner leads 6101 (6121) to inner leads 6105 (6125) without crossing metal wires 640. For example, the pad with letter "a" on the offset chip-stacked structure 50 is first connected to the metal fragment 6301 of bus bar 630 with a metal wire 640, and this metal fragment 6301 is used for ground connection; then the pad with letter "b" is connected to the inner lead 6101; then the pad with letter "c" on the offset chip-stacked structure 50 is connected to the metal fragment 6303 of bus bar 630 with a metal wire 640, and the metal fragment 6303 of bus bar 630 is connected to the inner lead 6103 with another metal wire 640; subsequently, the pad with letter "d" on the chip 500 is connected to the metal pad 6131 on the inner lead 6102 with a metal wire 640, and the metal pad 6131 is connected to the inner lead 6101 with another metal wire 640. Thus, the connection between the pads with letter "c" and "d" and the inner leads 6103 and 6101 can be made without crossing the metal wires 640 between the pad with letter "c" and the inner lead 6103 and between the pad with letter "d" and the inner lead 6101. Then, the jumping connection between the pad with letter "e" and the inner lead 6105 is performed. The pad with letter "e" on the offset chip-stacked structure 50 is connected to the metal fragment 6305 of bus bar 630 with a metal wire 640, and the metal fragment 6305 of bus bar 630 is connected to the inner lead 6105 with another metal wire 640. Thus the connection between the pad with letter "e" and the inner lead 6105 can be made without crossing the metal wire 640 connecting the pad with letter "f" and the inner lead 6104. Similarly, the connection of pads with letters "a'" to "f'" and the inner leads 6121 to 6125 can also be completed without crossing metal wires 640. The process of making jumping connection is the same as what is described above and would not be given unnecessary details.

Referring to FIG. 8B, more than one bus bar 630 are provided when more of the pads on the offset chip-stacked structure 50 need jumping connection. FIG. 8B shows the connection between the pads on the offset chip-stacked structure 50 and the inner leads. In the present embodiment, an insulation layer 611 is further provided on the inner leads 610 and at least one metal pad 613 is provided on the insulation layer 611. Apparently, at least one metal pad 613 and the bus bar 630 formed by a plurality of metal fragments (such as metal fragments 6301~63010) are served as transferring pads for making jumping connections between the pads with letters "a/a'" to "f/f'" and the inner leads 610 without crossing metal wires 640. For example, the pad with letter "a" or "a'" on the offset chip-stacked structure 50 is first connected to the metal fragment 6305 or 6306 of bus bar 630 with a metal wire 640, and this metal fragment 6305 or 6306 is used for ground connection; then the pad with letter "b" or "b'" on the offset chip-stacked structure 50 is connected to the metal fragment 6301 or 6302 of bus bar 630 with a metal wire 640, and the metal fragment 6301 or 6302 of bus bar 630 is connected to the metal pad 6131 or 6132 on the inner lead 6102 or 6122 with another metal wire 640; and then the metal pad 6131 and the inner lead 6101 are connected to the inner lead 6104 or 6124 with another metal wire 640. Subsequently, the pad with letter "d" or "d'" on the offset chip-stacked structure 50 is first connected to the metal pad 6133 or 6134 on the inner lead 6103 or 6123 with a metal wire 640, and the metal pad 6133 or 6134 is connected to the inner lead 6105 or 6125 with another metal wire.

Thus, the connection between the pad with letter "b" or "b'" and the inner lead 6102 or 6122 and the connection between the pad with letter "d" or "d'" and the inner lead 6105 or 6125 can be made without crossing the metal wires 640 between the pad with letter "b" or "b'" and the inner lead 6102 or 6122 and between the pad with letter "d" or "d'" and the inner lead 6105 or 6122. Then, the pad with letter "e" or "e'" is connected to the metal fragment 6307 or 6308 of bus bar 630, and the metal fragment 6307 or 6308 of bus bar 630 is connected to the inner lead 6102 or 6122 with another metal wire 640. Thus, the connection between the pad with letter "e" or "e'" and the inner lead 6102 or 6122 can be made without crossing another metal wire 640 connecting the pad with letter "f" or "f'" and the inner lead 6103 or 6123.

Consequently, the plurality of metal pads 613 is located on the inner leads 610 of leadframe 600 and the bus bars 630 is formed by the plurality of metal fragments (i.e. 6301~63010) that is provides a plurality of transfer pads for jumping connections to prevent the metal wires from crossing each other and avoid unnecessary short. Meanwhile, the metal pads 613 and the bus bars 630 make the circuit design more flexible and raise the reliability in package processing.

In the following, referring to FIGS. 9A and 9B, which are plain views of still another embodiment of chip-stacked package structure of the present invention. As shown in FIGS. 9A and 9B, the chip-stacked package structure comprises a leadframe 600 and an offset chip-stacked structure 50. The leadframe 600 is composed of a plurality of inner leads 610 arranged in rows facing each other, a plurality of outer leads (not shown), and a die pad 620 provided between the plurality of inner leads 610. The plurality of inner leads and the die pad 620 can be vertically distant. In the present embodiment, the offset chip-stacked structure 50 is set on the die pad 620, and the offset chip-stacked structure 50 is connected to the inner leads 610 of the leadframe 600 with metal wires 640.

Referring again to FIGS. 9A and 9B, an insulation layer 611 is further provided on the inner leads 610 in leadframe 600 of the chip-stacked package structure of the present invention and at least one metal pad 613 is further provided on the insulation layer 611, which provides the inner leads 610 with more transfer pads. With more transfer pads 613 on inner leads 610, the circuit design can become more flexible and be applied more extensively. Moreover, an insulation layer 632 is further provided on the bus bar 630 in the present invention and at least one metal pad 634 is further provided on the insulation layer 632, which provides the bus bar 630 with more transfer pads and allows the circuit design to become more flexible and be applied more extensively.

It is to be noted that the bus bar 630 can be arranged in a stripe-shaped configuration as shown in FIGS. 9A and 9B; or the bus bar 630 can also be arranged in a ring-shaped configuration (not shown). The shape of bus bars is not limited in the present invention. Moreover, as described above, the pads 312a/344 inside the bonding area 320 of the chip 500 can be arranged in single row or two rows and is not limited in the present invention.

The description will go to the part of using metal wires 640 to accomplish jumping connections. Apparently, the metal pads 613 on the inner leads 610 and the plurality of metal pads 634 on the bus bars 6301 and 6302 are served as transfer pads for making jumping connections between the pads with letters from "a" ("a'") to "f" ("f'") and the inner leads 6101 (6121) to inner leads 6105 (6125) without crossing metal wires 640. For example, the pad with letter "a" on the offset chip-stacked structure 50 is first connected to the bus bar 6301 with a metal wire 640, and the bus bar 6301 is used for ground connection; then the pad with letter "b" is connected to the inner lead 6102; then the pad with letter "c" on the offset chip-stacked structure 50 is connected to the metal pad 6131 on the inner lead 6102 with a metal wire 640, and the metal pad 6131 is connected to the inner lead 6101 with another metal wire 640. Thus, the connection between the pad with letter "c" and the inner lead 6101 can be made without crossing the metal wires 640 between the pad with letter "c" and the inner lead 6101 and between the pad with letter "b" and the inner lead 6102.

In the following, the pad with letter "d" on the offset chip-stacked structure 50 is connected to the metal pad 6133 on the inner lead 6103 with a metal wire 640, and the metal pad 6133 is connected to the inner lead 6104 with another metal wire 640. Then the jumping connection between the pad with letter "e" and the inner lead 6105 is performed. The pad with letter "e" on the offset chip-stacked structure 50 is first connected to the metal pad 6135 on the inner lead 6104 with a metal wire 640, and then the metal pad 6135 is connected to the inner lead 6105 with another metal wire 640. Finally, the jumping connection between the pad with letter "f" and the inner lead 6103 is performed. The pad with letter "f" on the offset chip-stacked structure 50 is first connected to the metal pad 6341 of the bus bar 6301 with a metal wire 640, and then the metal pad 6341 of the bus bar 6301 is connected to the inner lead 6103 with another metal wire 640. Thus the connection between the pads with letters "d", "e", and "f" and the inner leads 6103, 6104, 6105 can be made without crossing the metal wire 640 connecting the pad with letter "f" and the inner lead 6103. Similarly, the connection of pads with letters "a'" to "f'" and the inner leads 6121 to 6125 can also be completed without crossing metal wires 640. The process of making jumping connection is the same as what is described above and would not be given unnecessary details.

Referring to FIG. 9B, more than one bus bar 630 are provided when more of the pads on chip 500 need jumping connection. In the present embodiment, the inner leads 610 are provided with a plurality of metal pads 611 and the plurality of bus bars 630 are also provided with a plurality of metal pads 634 as transfer pads, wherein an insulation layer is provided between the metal pads 611 and the inner leads 611 and between the metal pads 634 and the bus bars 630 for insulation. The jumping connection in the present embodiment is the same as that in FIG. 9A and would not be given unnecessary details.

It is to be noted that the offset chip-stacked structure 50 is set on the leadframe 600 and the chips 500 can be that having same size and performing same function such as memory chips or chips having different sizes and performing different functions such as the case shown in FIGS. 2E and 5C (the chips on the uppermost layer being drive chips and the rest being memory chips). The detailed description for size and function of these chips is omitted hereinafter.

Figure 10:
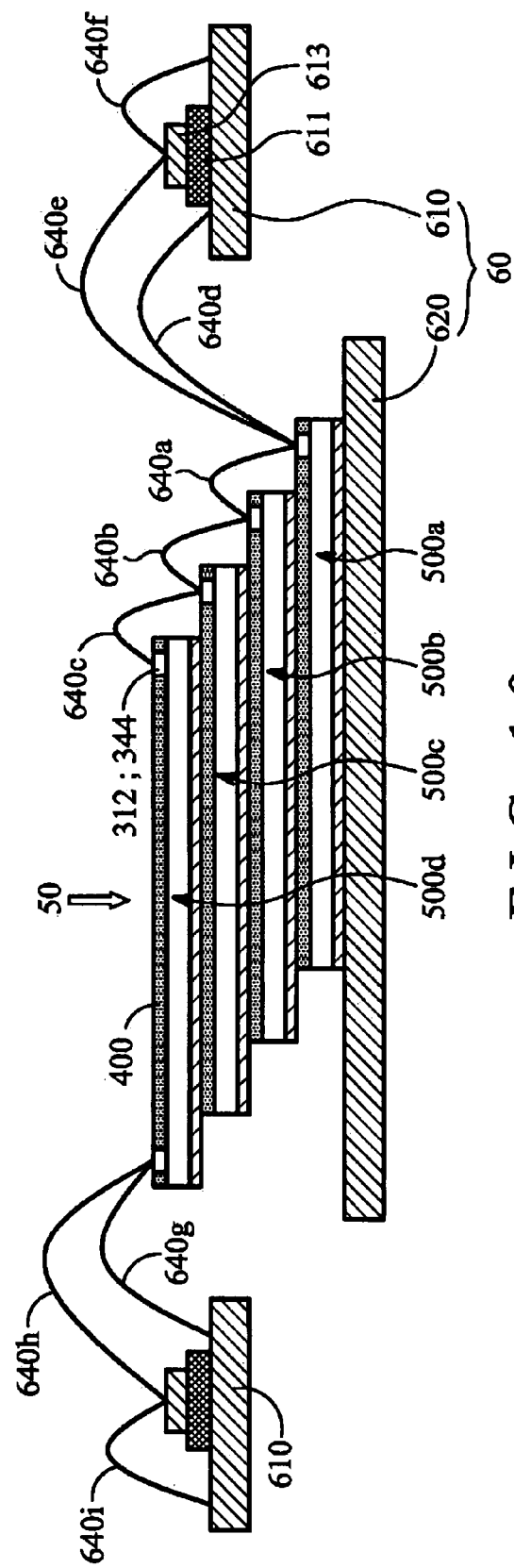
FIG. 10 is a cross-sectional view schematically showing the offset chip-stacked package structure in FIG. 6 according to the present invention.

Referring to FIG. 10, which is a cross-sectional view of the offset chip-stacked package structure in FIG. 6 drawn along section line A-A. As shown in FIG. 10, the leadframe 60 and the offset chip-stacked structure 50 are connected with a plurality of metal wires 640. The leadframe 60 is composed of a plurality of inner leads 610 arranged in rows facing each other, a plurality of outer leads (not shown), and a die pad 620 provided between the plurality of inner leads 610. The plurality of inner leads and the die pad 620 can be vertically distant. In the present embodiment, the inner leads 610 are further provided with an insulation layer 611 and the insulation layer 611 is further provided with at least one metal pad 613. The inner leads 610 are thus provided with more transfer pads, which allows the circuit design to become more flexible and be applied more extensively.

As shown in FIG. 10, the metal wire 640a has one end that connected to the first pad 312a or the third pad 344 of the chip 500a, and has the other end connected to the first pad 312a or the third pad 344 of the chip 500b via a wire-bonding process. Similarly, the metal wire 640b has one end that connected to the first pad 312a or the third pad 344 of the chip 500b and has the other end connected to the first pad 312a or third pad 344 of the chip 500c via a wire-bonding process. The metal wire 640c has one end that connected to the first pad 312a or the third pad 344 of the chip 500c and has the other end connected to the first pad 312a or third pad 344 of the chip 500d via a wire-bonding process. The metal wire 640d has one end that connected to the first pad 312a or third pad 344 of the chip 500a and has the other end connected to the inner leads 610 (inner lead 6101 or 6121 for example) of leadframe 600 via a wire-bonding process. In this way, the chips 500a, 500b, 500c and 500d are electrically connected to the leadframe 600 when the wire-bonding processes of the metal wires 640a, 640b, 640c, and 640d are completed. These metal wires 640a, 640b, 640c, and 640d can be gold made wires in one example.

Moreover, the inner leads 610 of the leadframe 600 in the present embodiment is provided with metal pads 613 as transferring pads for electrical connections such as power connections, ground connections, or signal connections. For example, when the metal pads 613 are used for signal connection, the metal wire 640e has its one end connected to the pads (pad with letter "b'" for example) of the chip 500a and has the other end connected to the metal pads 613 (metal pad 6132 for example), and the metal wire 640f has its one end connected to the metal pad 6132 and has the other end connected to one of the inner leads (inner lead 6123 for example). Moreover, the uppermost chip 500d of the structure 50 can further have same pads on the other side of it such as the arrangement shown in FIGS. 2D and 5B. Therefore, on the other side of chip 500a, a plurality of metal wires 640g are used to connect the chip 500a (pad with letter "a" for example) and the inner leads 610 (inner lead 6101 for example), while a metal wire 640h has its one end connected to the pads (pad with letter "b" for example) of chip 500a and the other end connected to the metal pads 613 (metal pad 6131 for example) and a metal wire 640i is used to connect the metal pad 6131 and one of the inner leads 610 (inner lead 6103 for example). By using metal pads 613 as transfer pads, the metal wires need not cross other metal wires and the degree of camber angle of the metal wires would not be increased, and thus the flexibility in the circuit design or application is enabled and the yield and reliability in package processing can be raised.

It is to be noted that the chip 500b is stacked on and adhered to the area outside the bonding area 320 of the chip 500a via a polymer material made adhesive layer 230 such as the arrangement shown in FIGS. 5A to 5C. However, the wire-bonding sequence of the metal wires 640 is not limited herein, which means it is also allowable to first bond the uppermost chip 500d and finally bond the lowermost chip 500a and then connect the chip 500a with the leadframe 600.

Then, referring to FIG. 11, which is a cross-sectional view of the offset chip-stacked package structure in FIG. 7A or 8A drawn along section lines A-A. As shown in FIG. 11, the leadframe 600 and the offset chip-stacked structure 50 are connected with a plurality of metal wires 640. The leadframe 600 is composed of a plurality of inner leads 610 arranged in rows facing each other, a plurality of outer leads (not shown), and a die pad 620 provided between the plurality of inner leads 610. The plurality of inner leads and the die pad 620 are vertically distant. At least one bus bar 630 is provided between the inner leads 610 and the die pad 620. In the present embodiment, the bus bar 630 and the die pad 620 are vertically at the same height. In the present embodiment, the inner leads 610 are further provided with an insulation layer 611 and the insulation layer 611 is further provided with at least one metal pad 613.

As shown in FIG. 11, the metal wire 640a has one end that connected to the first pad 312a or third pad 344 of the chip 500a and has the other end connected to the first pad 312a or the third pad 344 of the chip 500b via a wire-bonding process. Similarly, the metal wire 640b has one end that connected to the first pad 312a or the third pad 344 of the chip 500b and has the other end connected to the first pad 312a or the third pad 344 of the chip 500c via a wire-bonding process. The metal wire 640c has one end that connected to the first pad 312a or the third pad 344 of the chip 500c and has the other end connected to the first pad 312a or the third pad 344 of the chip 500d via a wire-bonding process. The metal wire 640d has one end connected to a pad of the chip 500a and has the other end connected to the inner leads 610 (inner lead 6102 or 6122 for example) of leadframe 600 via a wire-bonding process. In this way, the chips 500a, 500b, 500c and 500d are electrically connected to the leadframe 600 when the wire-bonding processes of the metal wires 640a, 640b, 640c, and 640d are completed. These metal wires 640a, 640b, 640c, and 640d can be gold made wires in one example.

Moreover, the inner leads 610 of the leadframe 600 in the present embodiment is provided with a plurality of metal pads 613 and bus bars 630 as transferring pads for electrical connections such as power connections, ground connections, or signal connections. Take FIG. 8 for example, when the bus bars 630 are used for electrical connection, the metal wire 640e has its one end connected to a pad (pad with letter "b" or "c" or "e" for example) of the chip 500a and has the other end connected to the bus bars 630 (bus bar 6302 for example), and the metal wire 640f has its one end connected to the bus bar 6302 and has the other end connected to one of the inner leads (inner lead 6123 for example). Then, the metal wire 640g has its one end connected to a pad (pad with letter "d" for example) of the chip 500a and has the other end connected to a metal pad (metal pad 6132 for example) on the inner lead 6122; and another metal wire 640h connects the metal pad 6132 and another inner lead (inner lead 6121 for example).

Moreover, the uppermost chip 500d of the structure 50 can further have same pads on the other side of it such as the arrangement shown in FIGS. 2D and 5B. Therefore, on the other side of chip 500d, a plurality of metal wires 640i are used to connect a pad on the chip 500d (pad with letter "b" for example) and the inner leads 610 (inner lead 6102 for example), while a metal wire 640j has its one end connected to a pad (pad with letter "c" for example) of chip 500d and the other end connected to a bus bar (bus bar 6303 for example) and a metal wire 640k is used to connect the bus bar 6303 and one of the inner leads (inner lead 6103 for example). Then, a metal wire 640m has its one end connected to a pad (pad with letter "d" for example) of chip 500a and the other end connected to the metal pads on the inner lead 6102 (metal pad 6131 for example); and a metal wire 640n connects the metal pad 6131 and another inner lead (inner lead 6101 for example).

It is to be noted that the chip 500b is stacked on and adhered to the area outside the bonding area 320 of the chip 500a via a polymer material made adhesive layer 230. However, the wire-bonding sequence of the metal wires 640 is not limited herein, which means it is also allowable to first bond the uppermost chip 500d and finally bond the lowermost chip 500a and then connect the chip 500a with the leadframe 600.

Figure 13:
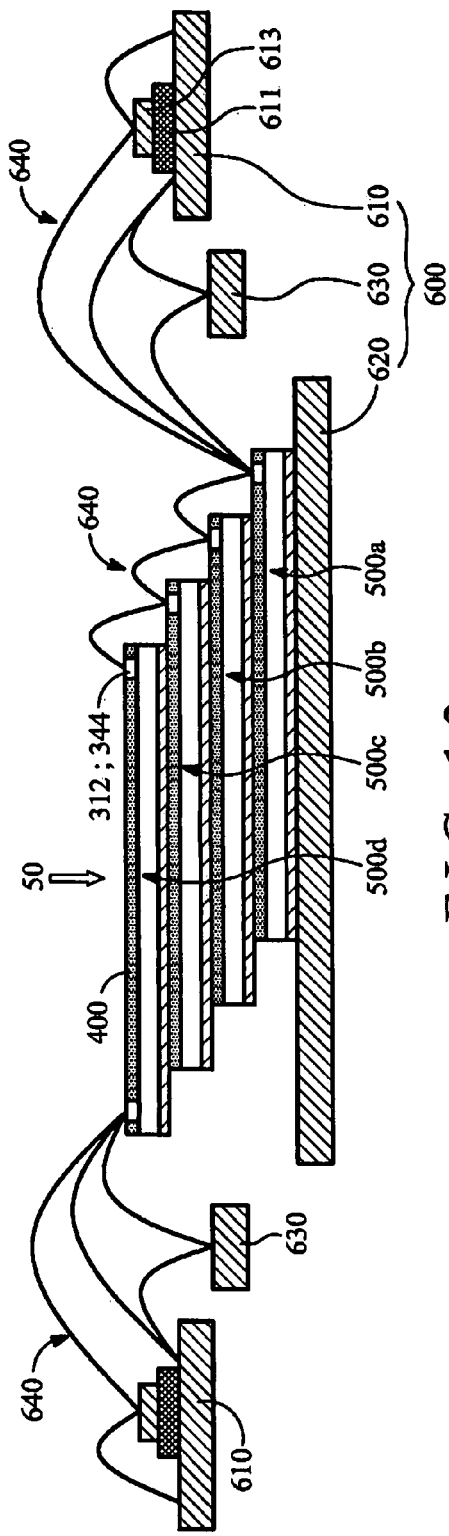
FIG. 13 is a cross-sectional view schematically showing an offset chip-stacked structure according to another embodiment of the present invention.
Figure 14:
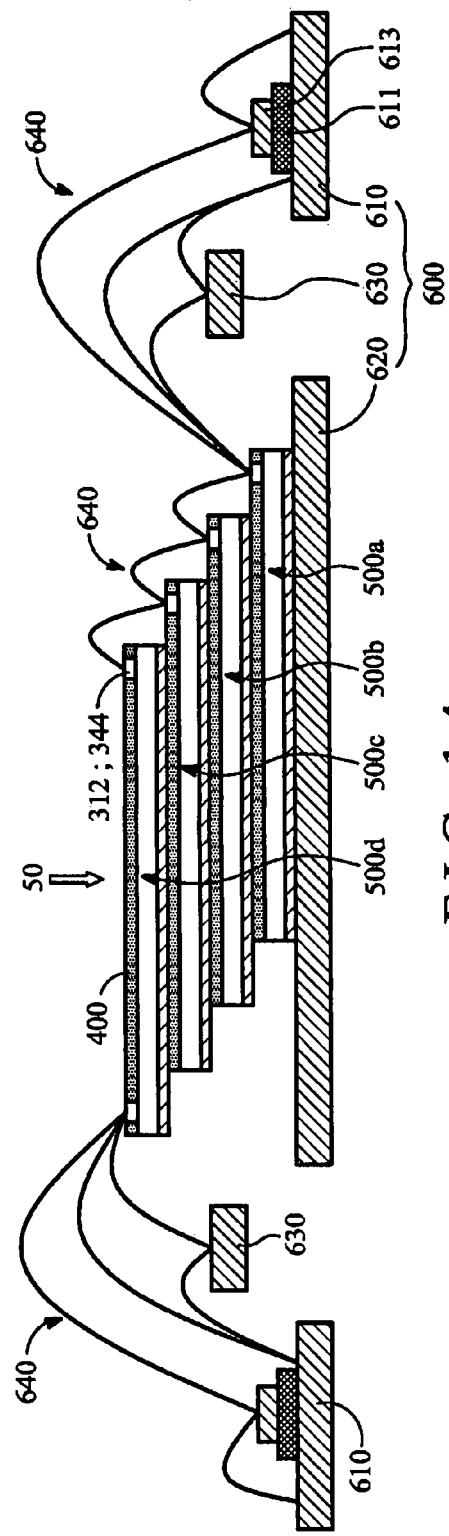
FIG. 14 is a cross-sectional view schematically showing an offset chip-stacked structure according to another embodiment of the present invention.

Then referring to FIGS. 12 to 14, show the cross-sectional views of another embodiment of offset chip-stacked structure of the present invention in FIG. 7A or 8A drawn along section lines A-A. FIGS. 12~14 and FIG. 11 described above are different in that the geometrical positions of bus bar 630 of leadframe 600 between the inner leads 610 and the die pad 620 are different. Take FIG. 12 of the present embodiment for example, the bus bar 630 and the inner leads 610 are vertically at the same height. In FIG. 13 of the present embodiment, the bus bar 630, the inner leads 610, and the die pad 620 are vertically at different heights. In FIG. 14 of the present embodiment, in the leadframe 600 the inner leads 610 and the die pad 620 are vertically at the same height, which is different from FIGS. 11~13, and the bus bar 630, the inner leads 610, and the die pad 620 are vertically at different heights. Apparently, FIGS. 12~14 are different only in the structure of leadframe 600, and the wire bonding and connecting processes via metal wires 640 between the leadframe 600 and the offset chip-stacked structure 50 are the same and would not be given unnecessary details.

Then, referring to FIG. 15, which is a cross-sectional view of another embodiment in FIG. 7B or 8B drawn along section lines B-B. FIG. 15 is different from FIGS. 11~14 in that more than one bus bar 630 is used in FIG. 15. The plurality of bus bars 630 can be arranged in a stripe-shaped configuration as shown in FIG. 7B, and can also be arranged in a ring-shaped configuration. The shape of bus bars is not limited herein. Similarly, the bus bars 630 in the present embodiment can further be formed by a plurality of metal fragments (i.e. 6301~63010). Apparently, increasing the number of the bus bars and therefore the number of transfer pads makes the connection of the pads (312a; 344) on the structure 50 more flexible. This prevents the metal wires from increasing bending degrees and enables flexibility in the circuit design or application and thus raises the yield and reliability in package processing. The process of using the metal wires 640 for connection between the lead frame 600 and the structure 50 is similar to what is described above and would not be given unnecessary details herein.

Then, referring to FIGS. 16~19, show the cross-sectional views of offset chip-stacked package structure in FIG. 9A drawn along section line A-A. As shown in FIG. 16, the leadframe 600 and the offset chip-stacked structure 50 are connected with a plurality of metal wires 640. The leadframe 600 is composed of a plurality of inner leads 610 arranged in rows facing each other, a plurality of outer leads (not shown), and a die pad 620 provided between the plurality of inner leads 610. The die pad 620 and the inner leads 610 are vertically at different heights. At least one bus bar 630 is provided between the inner leads 610 and the die pad 620. In the present embodiment, the inner leads 610 are further provided with an insulation layer 611 and the insulation layer 611 is further provided with at least one metal pad 613. The inner leads 610 are thus provided with more transfer pads, which allows the circuit design to become more flexible and be applied more extensively. Moreover, the bus bar 630 in the present embodiment and the die pad 620 are vertically at the same height.

Wherein the bus bar 630 can be arranged in a stripe-shaped configuration as shown in FIGS. 9A and 9B, and can also be arranged in a ring-shaped configuration (not shown). In order to provide the leadframe 600 with more contacts for electrical connections such as power connections, ground connections, or signal connections, the bus bar 630 in the present embodiment is further provided with an insulation layer 632 and the insulation layer 632 is further provided with at least one metal pad 634. The bus bar 630 is thus provided with more transfer pads, which allows the circuit design to become more flexible and be applied more extensively.

As shown in FIG. 16, the metal wire 640a has one end that connected to the first pad 312a or the third pad 344 of the chip 500a and has the other end that connected to the first pad 312a or the third pad 344 of the chip 500b via a wire-bonding process. Similarly, the metal wire 640b has one end that connected to the first pad 312a or the third pad 344 of the chip 500b and has the other end connected to the first pad 312a or the third pad 344 of the chip 500c via a wire-bonding process. The metal wire 640c has one end that connected to the first pad 312a or the third pad 344 of the chip 500c and has the other end connected to the first pad 312a or the third pad 344 of the chip 500d via a wire-bonding process. The metal wire 640d has one end that connected to a pad (pad with the letter "b'" for example) of the chip 500a and has the other end connected to the inner leads 610 (inner lead 6102 or 6122 for example) of leadframe 600 via a wire-bonding process. In this way, the chips 500a, 500b, 500c and 500d are electrically connected to the leadframe 600 when the wire-bonding processes of the metal wires 640a, 640b, 640c, and 640d are completed. These metal wires 640a, 640b, 640c, and 640d can be gold made wires in one example.

Moreover, the inner leads 610 of the leadframe 600 in the present embodiment is provided with a plurality of metal pads 613 and the bus bar 630 is also provided with a plurality of metal pads 634. The metal pads 613 and 634 can be served as transferring pads for electrical connections such as power connections, ground connections, or signal connections. Take FIG. 9A for example, when the metal pads 634 on the bus bar 630 are used for electrical connection, the metal wire 640e has its one end connected to a pad (pad with letter "f" for example) of the chip 500a and has the other end connected to the bus bar (bus bar 6342 for example), and the metal wire 640f has its one end connected to the bus bar 6342 and has the other end connected to one of the inner leads (inner lead 6123 for example). Then, the metal wire 640g has its one end connected to a pad (pad with letter "c'" for example) of the chip 500a and has the other end connected to a metal pad (metal pad 6132 for example) on the inner lead 6122; and another metal wire 640h connects the metal pad 6132 and another inner lead (inner lead 6121 for example). Moreover, the uppermost chip 500d of the offset chip-stacked structure 50 can further have same pads on the other side of it such as the arrangement shown in FIGS. 2D and 5B. Therefore, on the other side of chip 500d, a plurality of metal wires 640i are used to connect a pad on the chip 500d (pad with letter "b" for example) and the inner leads 610 (inner lead 6102 for example), while a metal wire 640j has its one end connected to a pad (pad with letter "f" for example) of chip 500d and the other end connected to a bus bar (bus bar 6341 for example) and a metal wire 640k is used to connect the bus bar 6341 and one of the inner leads (inner lead 6103 for example). Then, a metal wire 640m has its one end connected to a pad (pad with letter "d" for example) of chip 500a and the other end connected to a metal pad on the inner lead 6102 (metal pad 6133 for example); and a metal wire 640n connects the metal pad 6133 and another inner lead (inner lead 6104 for example).

Figure 17:
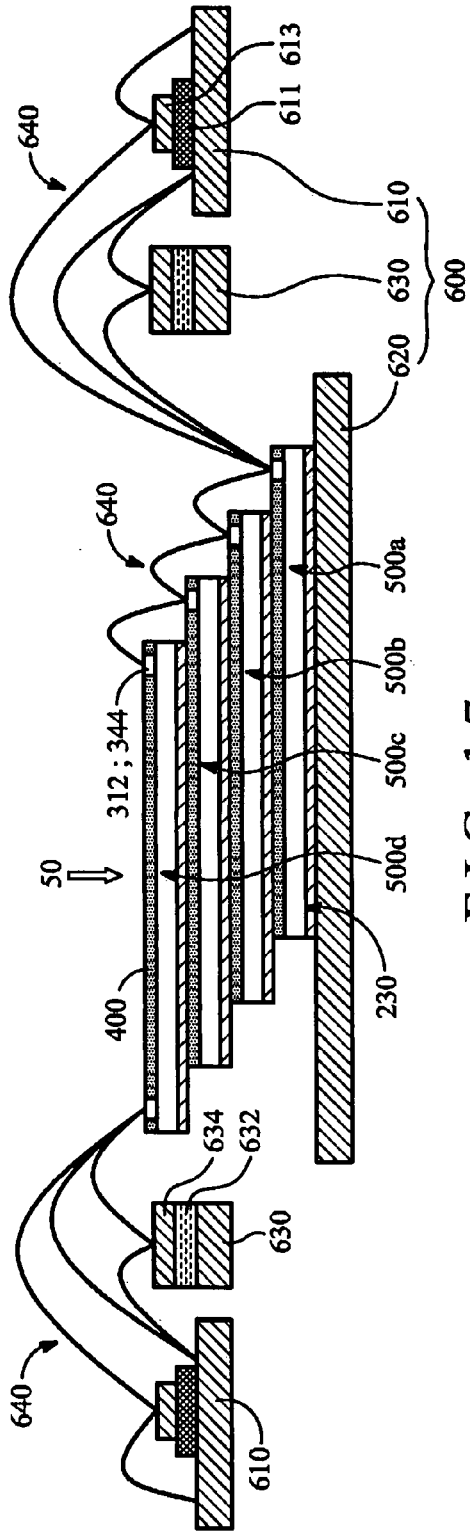
FIG. 17 is a cross-sectional view schematically showing an offset chip-stacked structure according to another embodiment of the present invention.
Figure 18:
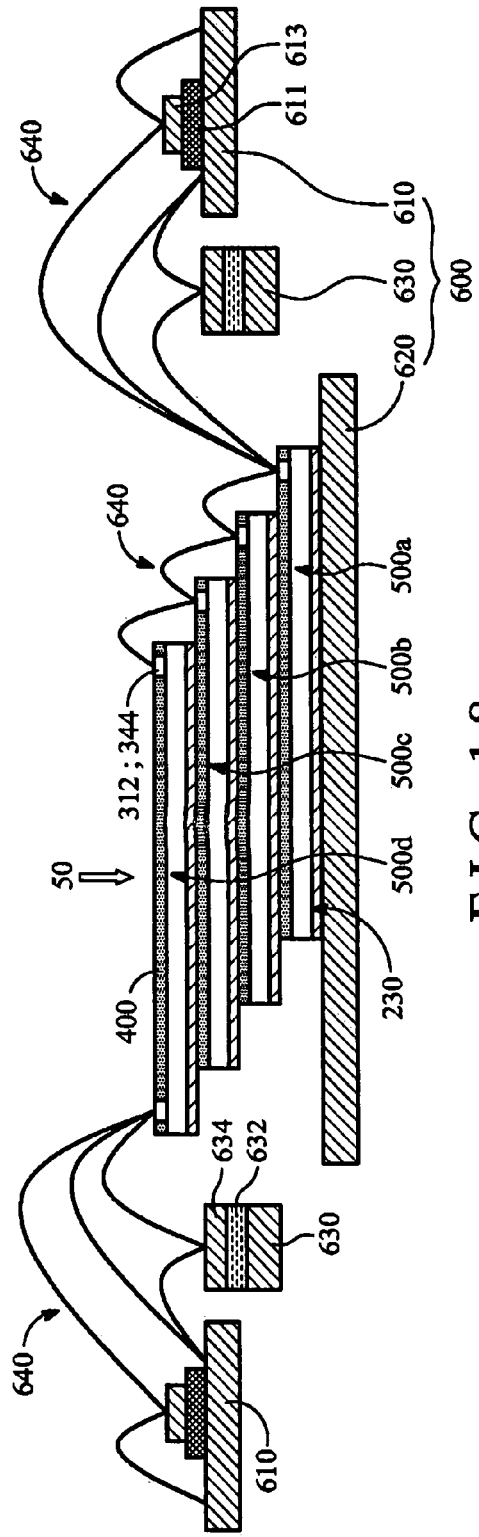
FIG. 18 is a cross-sectional view schematically showing an offset chip-stacked structure according to another embodiment of the present invention.
Figure 19:
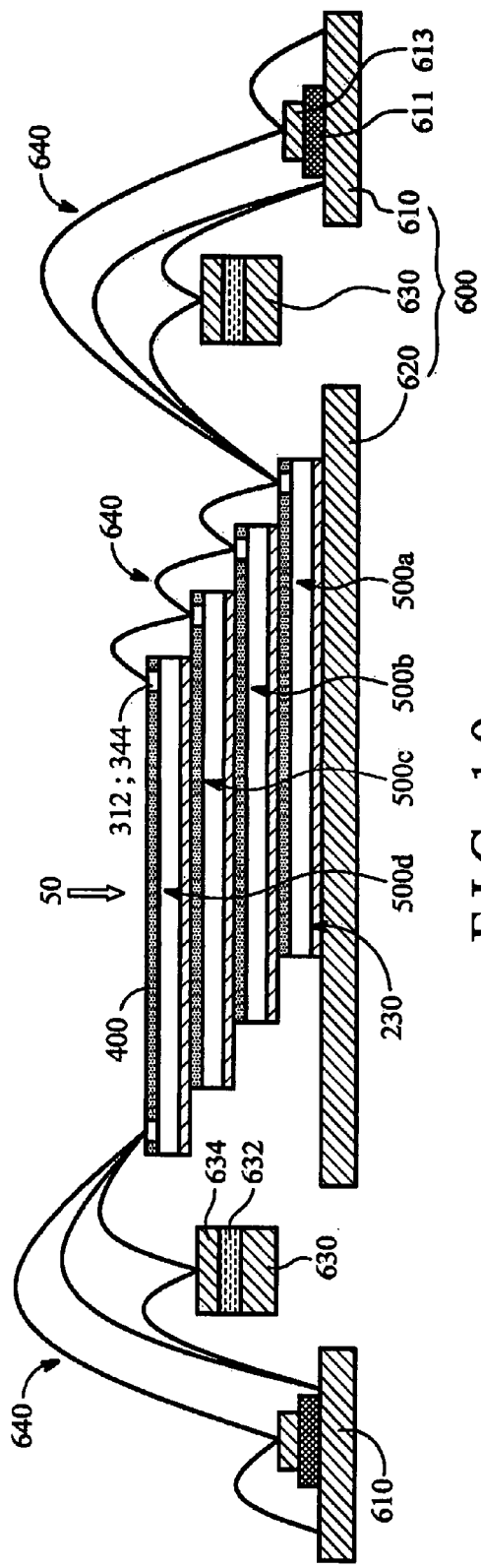
FIG. 19 is a cross-sectional view schematically showing an offset chip-stacked structure according to another embodiment of the present invention.

Then, referring to FIGS. 17~19, which is a cross-sectional view of another embodiment of offset chip-stacked package structure of the present invention in FIG. 9A drawn along section line A-A. FIGS. 17~19 and FIG. 16 described above are different in that the geometrical positions of bus bar 630 of leadframe 600 between the inner leads 610 and the die pad 620 are different. Take FIG. 17 of the present embodiment for example, the bus bar 630 and the inner leads 610 are vertically at the same height. In FIG. 18 of the present embodiment, the bus bar 630, the inner leads 610, and the die pad 620 are vertically at different heights. In FIG. 19 of the present embodiment, in the leadframe 600 the inner leads 610 and the die pad 620 are vertically at the same height, which is different from FIGS. 16~18, and the bus bar 630, the inner leads 610, and the die pad 620 are vertically at different heights. Apparently, FIGS. 17~19 are different only in the structure of leadframe 600, and the wire bonding and connecting processes via metal wires 640 between the leadframe 600 and the offset chip-stacked structure 50 are the same and would not be given unnecessary details.

Figure 20:
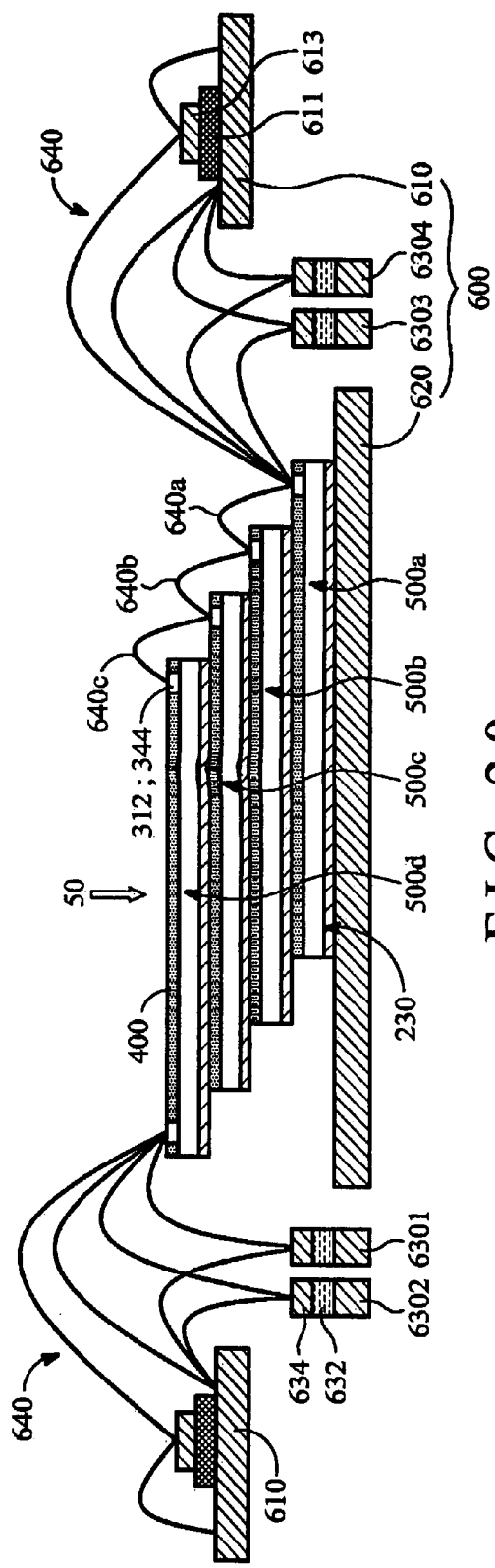
FIG. 20 is a cross-sectional view schematically showing an offset chip-stacked structure according to another embodiment of the present invention.

Then, referring to FIG. 20, which is a cross-sectional view of another embodiment in FIG. 9B drawn along section line B-B. FIG. 20 is different from FIGS. 16~19 in that more than one bus bar 630 is used in FIG. 20. The plurality of bus bars 630 can be arranged in a stripe-shaped configuration as shown in FIG. 9B, and can also be arranged in a ring-shaped configuration (not shown). The shape of bus bars is not limited herein. Apparently, increasing the number of the bus bars and therefore the number of transfer pads makes the connection of the pads (312a; 344) on the structure 50 more flexible. This prevents the metal wires from increasing bending degrees and enables flexibility in the circuit design or application and thus raises the yield and reliability in package processing. The process of using the metal wires 640 for connection between the lead frame 600 and the structure 50 is similar to what is described above and would not be given unnecessary details herein.

As described in the above embodiments, the number of the chips of the chip-stacked structure 50 is not so limited, and any person skilled in the art could manufacture a chip-stacked structure including at least three chips according to the above-disclosed method. Meanwhile, the direction toward which the offset of each chip occurs in forming the structure 50 is not so limited by the above-disclosed embodiments. The chip-stacked structure can be formed with each chip having an offset toward the direction opposite to the original one disclosed in the above embodiments. The connection methods for the chips of the offset chip-stacked structure 70 and between the structure 70 and the leadframe 600 and the wire-bonding method for the offset chip-stacked structure 70 and the leadframe 600 using metal wires 640 are similar to those disclosed in the above-mentioned embodiments and would not be given unnecessary details herein.

Figure 21:
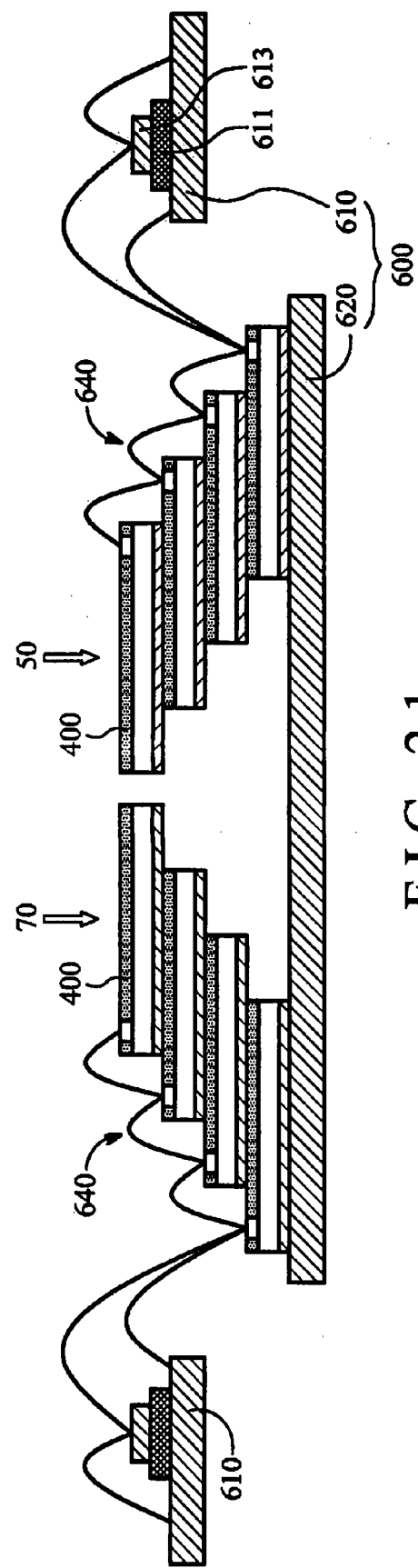
FIG. 21 is a cross-sectional view schematically showing an offset chip-stacked structure according to another embodiment of the present invention.

The inner leads 610 on leadframe 600 are arranged in rows facing each other, and the inner leads 610 are provided with a plurality of metal pads 613. Therefore, the present invention further proposes a combination structure in which two offset chip-stacked structures with chips of each structure being offset toward opposite directions are combined together. An example of such is shown in FIG. 21. Referring to FIG. 21, the structures 50 and 70 are provided together on a die pad 620 of a leadframe 600. The connection method for the chips of the structures 70 and 50 and the wire-bonding method for the chips and the leadframe are similar to that disclosed in the above-mentioned embodiments and would not be given unnecessary details herein.

Figure 22:
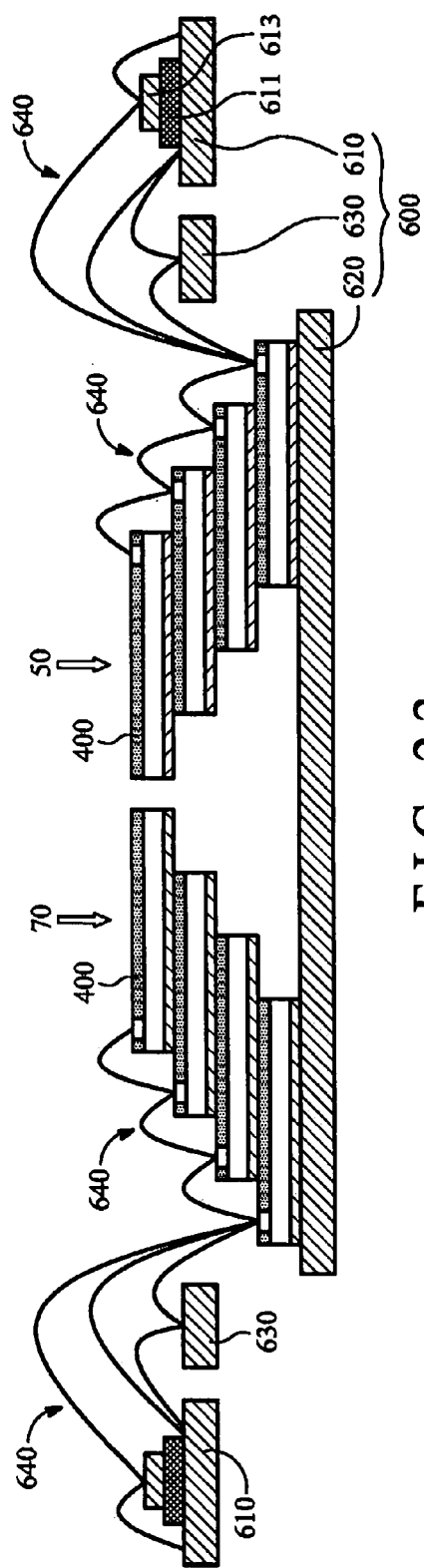
FIG. 22 is a cross-sectional view schematically showing an offset chip-stacked structure according to another embodiment of the present invention.
Figure 23:
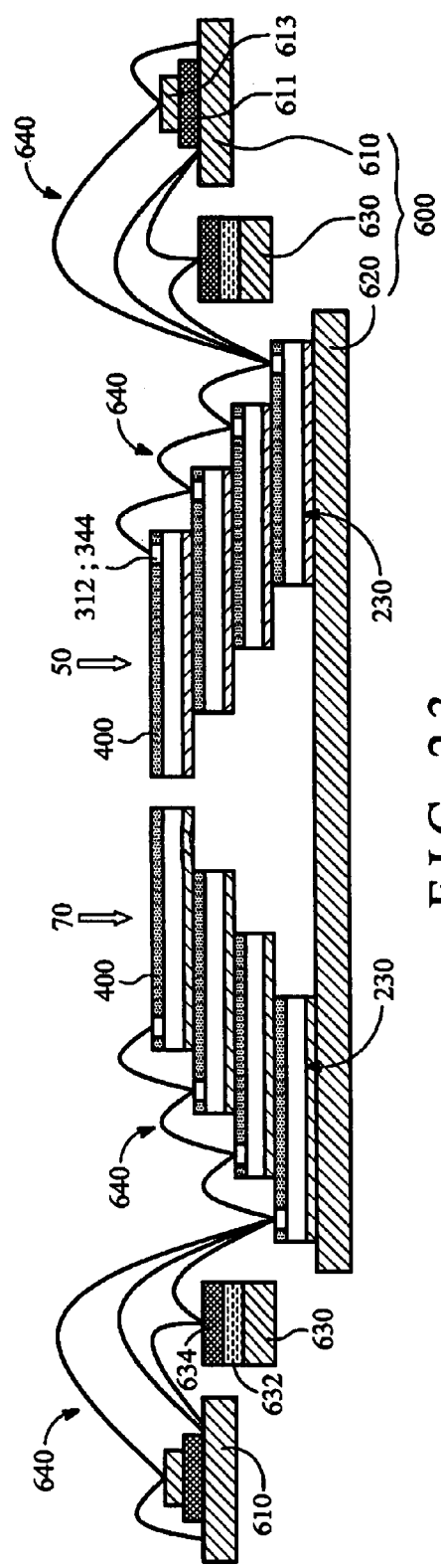
FIG. 23 is a cross-sectional view schematically showing an offset chip-stacked structure according to another embodiment of the present invention.

Then, referring to FIGS. 22 and 23, apparently, the difference between FIG. 22 and FIG. 21 is that at least one bus bar 630 is provided in FIG. 22 and a plurality of metal pads 634 can be selectively provided on the bus bar 630, as shown in FIG. 23. The connection methods for the chips of the offset chip-stacked structures 50 and 70 and between the structures and the leadframe 600 and the wire-bonding method for the offset chip-stacked structures 50 and 70 and the leadframe 600 using metal wires 640 are similar to those disclosed in the above-mentioned embodiments and would not be given unnecessary details herein. The number of pads for electrical connections is thus increased and the connection of the pads (312a; 344) on the structures 50 and 70 is also made more flexible. This prevents the metal wires from increasing bending degrees and enables flexibility in the circuit design or application and thus raises the yield and reliability in package processing. It is to be noted that the height configuration of the inner leads 610, the die pad 620, and the bus bar 630 of leadframe 600 and related description above can also be applied in the embodiments in FIGS. 22 and 23.

It is to be noted again that in all the embodiments described above, the insulation layer 611 on the inner leads 610 and the insulation layer 632 on the bus bar 630 can both be formed by coating or printing a polymer material such as polyimide (PI) or by attaching a tape such as die attached film. The metal pads 613 or 634 can be metal layers formed on the insulation layers 611 and 632 by plating process and etching process. It is to be noted that the insulation layers 611 and 632 can be formed on the entire inner leads 610 and the entire bus bar 630 or formed only on fragmental sections of the inner leads 610 and the bus bar 630, which is not limited herein. Furthermore, another insulation layer formed on the metal pads 611 and 634 and other metal pads formed on this another insulation layer would be allowed for adding more transfer pads.

Figure 24:
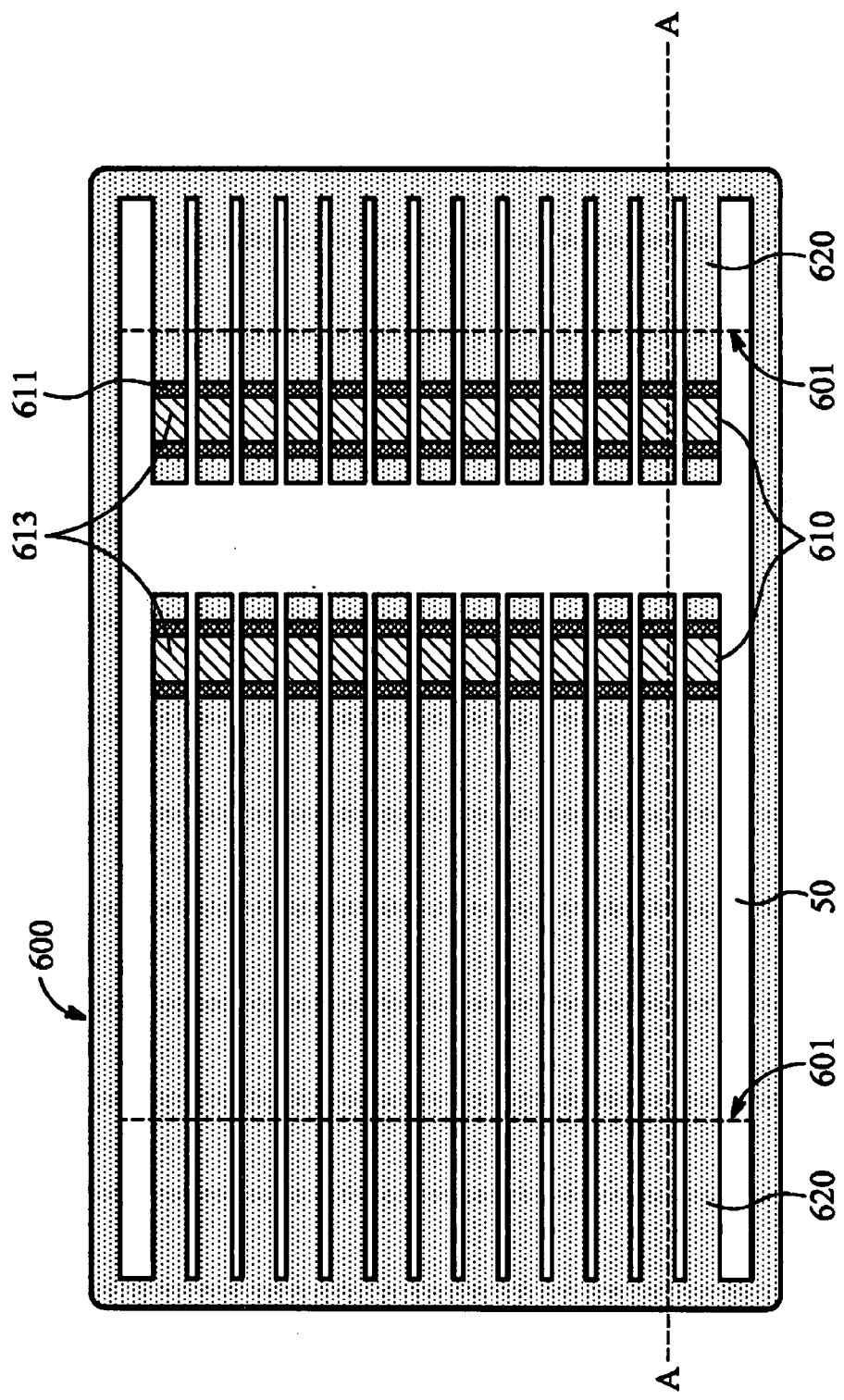
FIG. 24 is a top-elevational view schematically showing a leadframe according to an embodiment of the present invention.

The present invention then provides a chip-stacked package structure with unbalanced leadframe having inner leads 610 formed with a plurality of transfer pads. Referring to FIG. 24, which is a cross-sectional view of the leadframe of another embodiment of the present invention. As shown in FIG. 24, the leadframe 600 is composed of a plurality of inner leads 610 arranged in rows facing each other and a plurality of outer leads 620. The inner leads 610 comprise a plurality of first inner leads 615 in parallel and second inner leads 616 in parallel. The ends of the first inner leads 615 and the ends of the second inner leads 616 are arranged opposite each other at a distance, and the first inner leads 615 and the second inner leads 616 thus are in rows facing each other but vertically at different heights. Moreover, an insulation layer 611 is provided near the ends of first inner leads 615 and second inner leads 616 and at least one metal pad 613 is further provided on the insulation layer 611.

Figure 25:
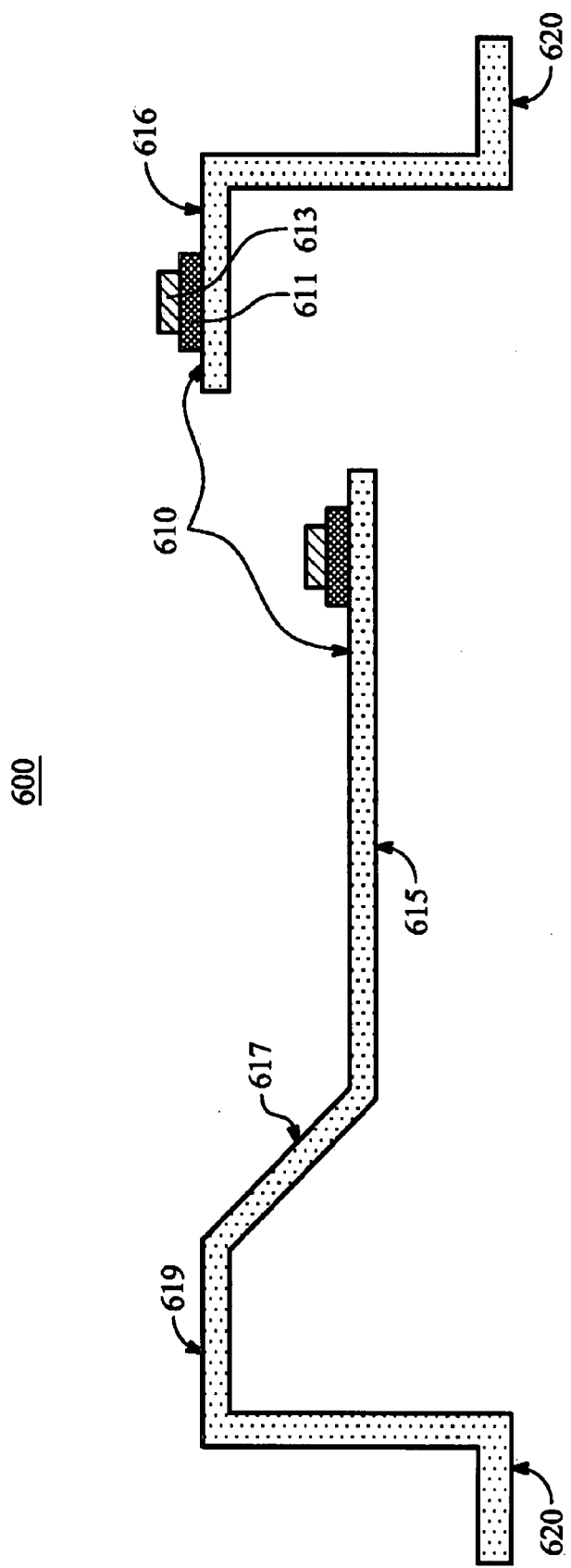
FIG. 25 is a cross-sectional view schematically showing the leadframe in FIG. 24 according to the present invention.

Then, referring to FIG. 25, the first inner leads 615 is equipped with a downset structure formed by a platform portion 619 and a connecting portion 617, wherein the platform portion 619 and the second inner leads 616 are vertically at the same height. Moreover, the shape of connecting portion 617 can be a slope or a near-vertical surface and is not limited in the present invention. It is also to be noted that the platform portion 619 and the connecting portion 617 can also be part of first inner leads 615.

Figure 26:
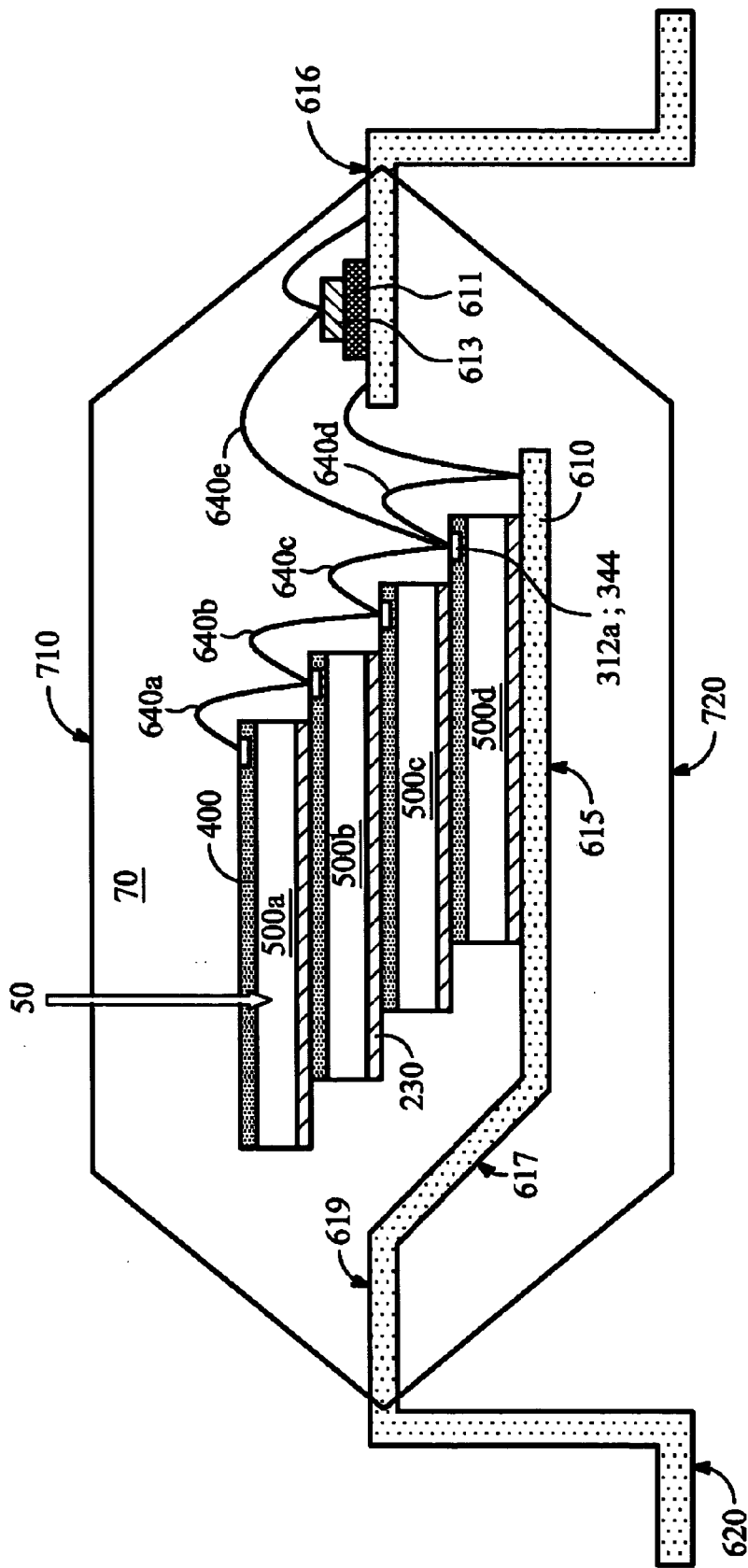
FIG. 26 is a cross-sectional view schematically showing an offset chip-stacked structure according to another embodiment of the present invention.

Then, referring to FIG. 26, which is a cross-sectional view of an offset chip-stacked package structure of the present invention. First, the first inner leads 615 of leadframe 600 and the offset chip-stacked structure are connected via an adhesive layer 230. The second inner leads 616 are provided with an insulation layer 611 and the insulation layer 611 is further provided with at least one metal pad 613. Apparently, the adhesive layer 230 in FIG. 26 is adhered to the back surface of the chip 500, as shown in FIG. 2. Moreover, the adhesive layer 230 can also be provided on the first inner leads 615 of leadframe 600 and connected to the offset chip-stacked structure 50. In addition, the first inner leads 615 of leadframe 600 and the offset chip-stacked structure 50 can also be connected via a tape, and more particularly, a die attached film.

After the connection of the leadframe 600 and the offset chip-stacked structure 50 is made, the connection of metal wires is performed. Referring to FIG. 26, the metal wire 640a has one end connected to a pad (such as first pad 312a or third pad 344 in FIG. 3) of the chip 500a and has the other end connected to the first pad 312a or third pad 344 of the chip 500b via a wire-bonding process. Similarly, the metal wire 640b has one end that connected to the first pad 312a or third pad 344 of the chip 500b and has the other end connected to the first pad 312a or third pad 344 of the chip 500c via a wire-bonding process. The metal wire 640c has one end that connected to the first pad 312a or the third pad 344 of the chip 500c and has the other end connected to the first pad 312a or third pad 344 of the chip 500d via a wire-bonding process. Then the metal wire 640d electrically connects the chip 500d and the first inner leads 615 of leadframe 600, and the metal wire 640e electrically connects the chip 500d and the second inner leads 616. In this way, the chips 500a, 500b, 500c and 500d are electrically connected to the first inner leads 615 and second inner leads 616 of leadframe 600 when the wire-bonding processes of the metal wires 640a, 640b, 640c, 640d, and 640e are completed. These metal wires 640a, 640b, 640c, 640d, and 640e can be gold made wires. Then, a metal wire 640f can selectively connect the chip 500d and the metal pad 613 of the second inner leads 616, and another metal wire 640g is provided to complete the connection to one of the second inner leads 616. Finally, in the offset chip-stacked package structure in which the electrical connection is completed, an encapsulant 70 is provided to cover the offset chip-stacked structure 50, the platform portion 619 and the second inner leads 616 of leadframe 600 with the outer leads 620 of leadframe 600 extending out of the encapsulant 70, and the chip-stacked package structure is thus formed.

In addition to the above-mentioned process, the connection of leadframe 600 and offset chip-stacked structure 50 via metal wires 640 can also be made by first performing the electrical connections of chips 500a, 500b, 500c, and 500d via metal wires after the offset chip-stacked structure 50 is formed. The process of connecting chips 500a, 500b, 500c, and 500d is the same as that disclosed above. Then the connection of metal wires is performed again after the electrically connected offset chip-stacked structure 50 is adhered to the leadframe 600 for connecting the offset chip-stacked structure 50 and the inner leads 610 of leadframe 600.

As described in the above embodiments, the number of the chips of the chip-stacked structure 50 is not so limited, and any person skilled in the art could manufacture a chip-stacked structure including at least three chips according to the above-disclosed method. Similarly, the chip-stacked structure 50 in the embodiment in FIG. 26 can also be chip-stacked structure 30. The wire bonding processes of chip-stacked structures 30 and 50 with the leadframe 600 are the same and therefore would not be given unnecessary details.

Figure 27:
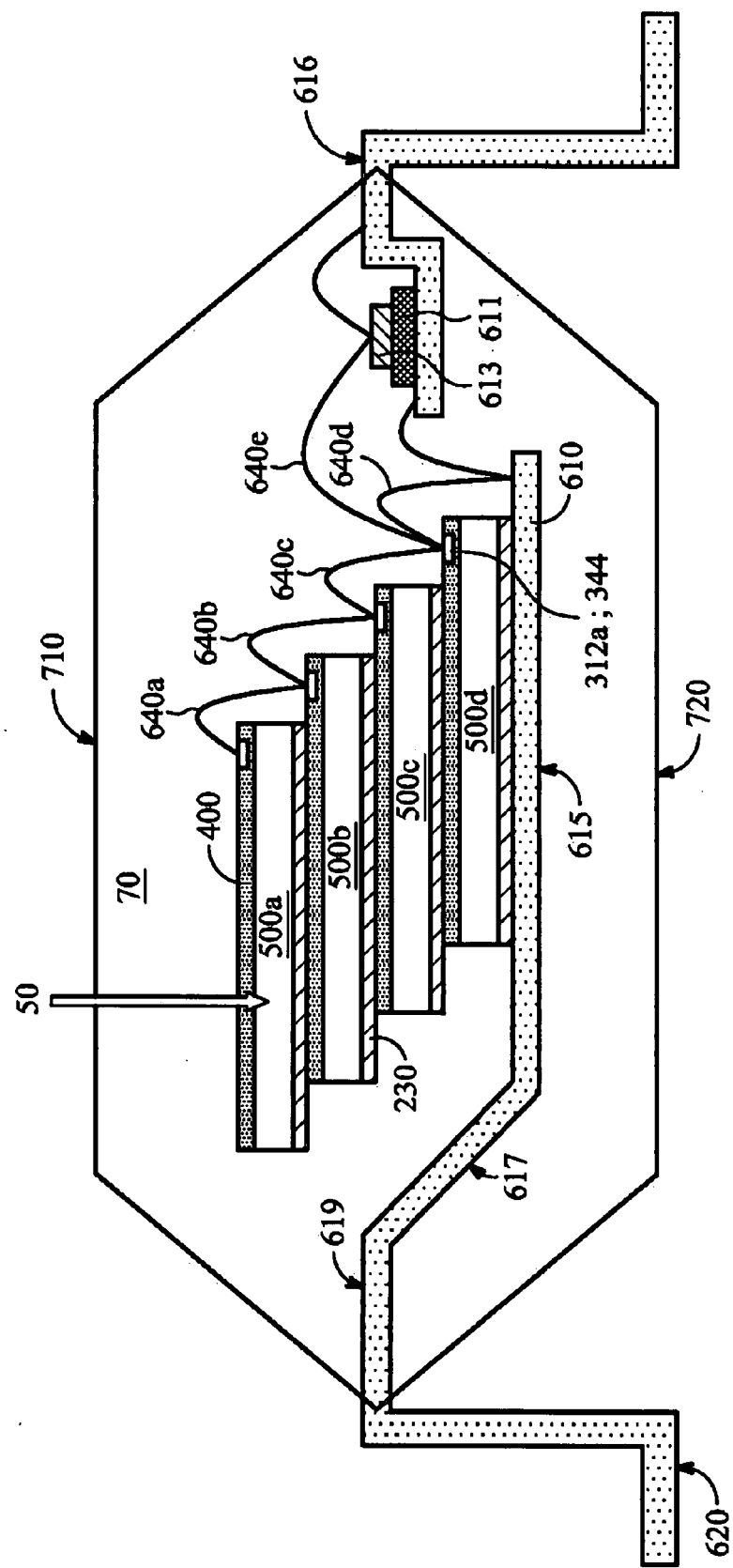
FIG. 27 is a cross-sectional view schematically showing an offset chip-stacked structure according to another embodiment of the present invention.

Referring to FIG. 27, which is a cross-sectional view of the offset chip-stacked package structure of another embodiment of the present invention. As shown in FIG. 27, the leadframe 600 is composed of a plurality of inner leads 610 arranged in rows facing each other and a plurality of outer leads 620. The inner leads 610 comprise a plurality of first inner leads 615 in parallel and second inner leads 616 in parallel. The ends of the first inner leads 615 and the ends of the second inner leads 616 are arranged opposite each other at a distance, and the first inner leads 615 and the second inner leads 616 thus are in rows facing each other but vertically at different heights. Referring to FIG. 27, the first inner leads 615 is equipped with a downset structure formed by a platform portion 618 and a connecting portion 617. A concave ladder-like structure 6161 is formed at the ends of the second inner leads 616 and the concave ladder-like structure 6161 is further provided with an insulation layer 611 and the insulation layer is further provided with at least one metal pad 613. The rest of the structure is the same as the second inner leads 616 in FIG. 26. Apparently, the difference between the present embodiment and FIG. 26 is that in the present embodiment, a concave ladder-like structure 6161 is formed at the ends of the second inner leads 616. The end of the concave ladder-like structure 6161 is vertically lower than the second inner leads 616. Thus when the connection of metal wires 640 is performed, the metal wire 640e connects the chip 500d and the end of the concave ladder-like structure 615. The bending degree of metal wire 640e is thus decreased. The wire bonding processes in FIGS. 26 and 27 are the same and would not be given unnecessary details herein.

Figure 28:
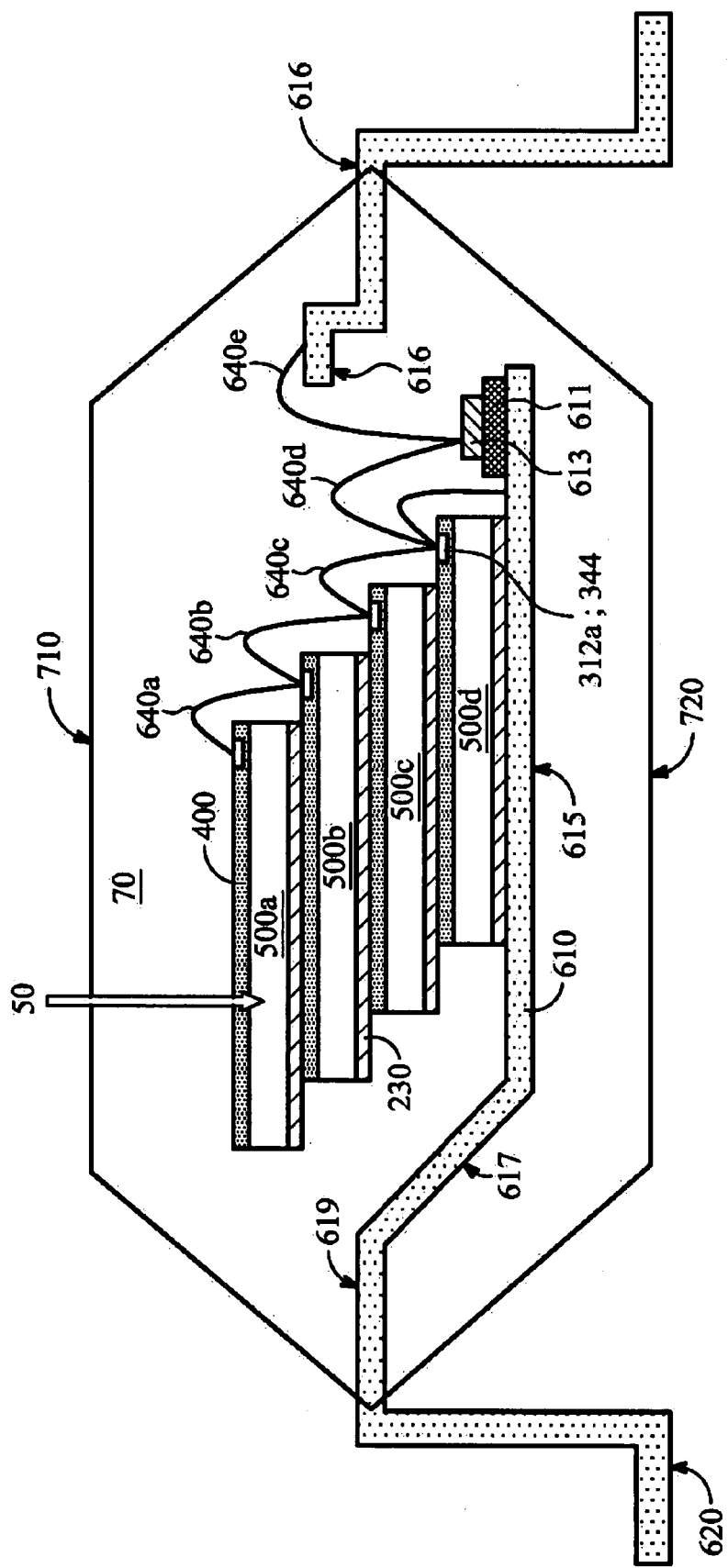
FIG. 28 is a cross-sectional view schematically showing an offset chip-stacked structure according to another embodiment of the present invention.

Then, referring to FIG. 28, which is a cross-sectional view of the offset chip-stacked package structure of another embodiment of the present invention. The different between FIG. 27 and FIG. 28 is that the first inner leads 615 in FIG. 28 is further provided with an insulation layer 611 and the insulation layer 611 is further provided with at least one metal wire 613 and a protruding ladder-like structure 6162 is formed at the ends of the second inner leads 616. Apparently, the end of the protruding ladder-like structure 6162 is vertically higher than the second inner leads 616. Thus when the connection of metal wires 640 is performed, the metal wire 640d connects the chip 500d and the metal pad 613 on the first inner leads 615, and another metal wire 640e connects the metal pad 613 on the first inner leads 615 and the end of the protruding ladder-like structure 6162. Thus a chip-stacked package structure is formed. The wire bonding processes in FIGS. 26, 27, and 28 are the same and would not be given unnecessary details herein. It is to be noted that the metal pad 613 can be provided on the first inner leads 615 and the second inner leads 616. What is described above in FIGS. 26, 27 and 28 are only embodiments of the present invention and should not be used to limit the present invention.

While the invention has been described by way of examples and in terms of the preferred embodiments, it is to be understood that the invention is not limited to the disclosed embodiments. To the contrary, it is intended to cover various modifications and similar arrangements as would be apparent to those skilled in the art. Therefore, the scope of the appended claims should be accorded the broadest interpretation so as to encompass all such modifications and similar arrangements.

What is claimed is:

1. A chip-stacked package structure with a leadframe having inner leads, each inner lead having a plurality of transfer pads, comprising:
    the leadframe, composed of a plurality of inner leads arranged in rows facing each other, a plurality of outer leads, and a die pad, wherein said die pad is provided between said plurality of inner leads arranged in rows facing each other and vertically distant from said plurality of inner leads, positions of a top surface of each of said inner leads being partially coated with an insulation layer and a plurality of metal pads being selectively formed on said insulation layer to define said respective pads;
    an offset chip-stacked structure formed with a plurality of chips stacked together, said offest chip-stacked structure being set on said die pad and electrically connected to said plurality of inner leads arranged in rows facing each other;
    an encapsulant partially covering said offset chip-stacked structure and said leadframe, said plurality of outer leads extending out of said encapsulant; and
    at least a bus bar being provided between said plurality of inner leads arranged in rows facing each other and said die pad, said bus bar being further coated with an insulation layer and a plurality of metal pads being selectively formed on said insulation layer to define said respective pads.

2. A chip-stacked package structure with a leadframe having inner leads, each inner lead having a plurality of transfer pads, comprising:
    the leadframe, composed of a plurality of inner leads arranged in rows facing each other, a plurality of outer leads, and a die pad, said die pad being provided between said plurality of inner leads arranged in rows facing each other and vertically distant from said plurality of inner leads;
    a plurality of offset chip-stacked structures, being set on said die pad and electrically connected to said plurality of inner leads arranged in rows facing each other;
    an encapsulant, covering said plurality of offset chip-stacked structures and said leadframe, said plurality of outer leads extending out of said encapsulant; and
    at least a bus bar being provided between said plurality of inner leads arranged in rows facing each other and said die pad;
    wherein positions of a top surface of each of said inner leads in said leadframe being partially coated with an insulation layer, said bus bar being further coated with an insulation layer, and a plurality of metal pads are selectively formed on said insulation layer to define said respective pads.

3. The chip-stacked package structure as set forth in claim 2, wherein said bus bar is formed by a plurality of metal fragments.

* * * * *